US012765212B2

(12) United States Patent
Shin

(10) Patent No.: US 12,765,212 B2
(45) Date of Patent: Oct. 13, 2026

(54) DISPLAY DEVICE THAT PROVIDES VISUAL INFORMATION

(71) Applicant: Samsung Display Co., LTD., Yongin-si (KR)

(72) Inventor: Ho-Yong Shin, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 402 days.

(21) Appl. No.: 18/377,061

(22) Filed: Oct. 5, 2023

(65) Prior Publication Data

US 2024/0244915 A1 Jul. 18, 2024

(30) Foreign Application Priority Data

Jan. 12, 2023 (KR) ........................ 10-2023-0004964

(51) Int. Cl.

*H10K 59/38* (2023.01)
*H10K 59/122* (2023.01)
*H10K 59/126* (2023.01)
*H10K 59/35* (2023.01)
*H10K 59/80* (2023.01)

(52) U.S. Cl.

CPC ........... *H10K 59/38* (2023.02); *H10K 59/122* (2023.02); *H10K 59/126* (2023.02); *H10K 59/352* (2023.02); *H10K 59/353* (2023.02); *H10K 59/877* (2023.02)

(58) Field of Classification Search

CPC .... H10K 59/38; H10K 59/122; H10K 59/126; H10K 59/352; H10K 59/353; H10K 59/877

See application file for complete search history.

(56) References Cited

U.S. PATENT DOCUMENTS

2011/0180821 A1* 7/2011 Matsushima ........ H10K 59/122 438/34
2018/0164640 A1 6/2018 Kim et al.
(Continued)

FOREIGN PATENT DOCUMENTS

CN 107895736 A 4/2018
CN 108807457 A 11/2018
(Continued)

OTHER PUBLICATIONS

Office Action issued Jun. 25, 2026 in Application No. KR 10-2023-0004964, 17 pages.

*Primary Examiner* — Tracie Y Green
(74) *Attorney, Agent, or Firm* — CANTOR COLBURN LLP

(57) ABSTRACT

A display device includes: a substrate including a first pixel area and a second pixel area disposed adjacent to each other, each of the first pixel area and the second pixel area including a first light-emitting area, a second light-emitting area, a third light-emitting area, and a non-light-emitting area, a light-emitting element disposed in each of the first, second, and third light-emitting areas on the substrate, a bank layer disposed in the non-light-emitting area on the light-emitting element and defining first openings respectively overlapping the first light-emitting areas of the first and second pixel areas and a first central opening extending to the first openings, and a first color conversion layer including first quantum dots and filling the first openings and the first central opening.

20 Claims, 20 Drawing Sheets

(56) References Cited

U.S. PATENT DOCUMENTS

| | | | | |
|---|---|---|---|---|
| 2019/0123115 | A1* | 4/2019 | Sun | H10K 77/10 |
| 2020/0328256 | A1 | 10/2020 | Lee et al. | |
| 2021/0111363 | A1 | 4/2021 | Hwang et al. | |
| 2021/0135160 | A1* | 5/2021 | Sun | H10K 59/122 |
| 2022/0173168 | A1* | 6/2022 | Kim | H10K 59/38 |
| 2022/0399423 | A1* | 12/2022 | Du | H10K 59/131 |

FOREIGN PATENT DOCUMENTS

| | | | |
|---|---|---|---|
| CN | 111704827 | A | 9/2020 |
| JP | 2021039938 | A | 3/2021 |
| KR | 1020070049172 | A | 5/2007 |
| KR | 20180066936 | A | 6/2018 |
| KR | 20200121430 | A | 10/2020 |
| KR | 102223421 | B1 | 3/2021 |
| KR | 20210043776 | A | 4/2021 |

* cited by examiner

DISPLAY DEVICE THAT PROVIDES VISUAL INFORMATION

This application claims priority to Korean Patent Application No. 10-2023-0004964, filed on Jan. 12, 2023, and all the benefits accruing therefrom under 35 U.S.C. § 119, the content of which in its entirety is herein incorporated by reference.

BACKGROUND

1. Field

Embodiments provide generally to a display device. More particularly, embodiments relate to a display device that provides visual information.

2. Description of the Related Art

With a development of information technology, an importance of a display device, which is a connection medium between a user and information, is being highlighted. For example, a use of a display device such as a liquid crystal display device, an organic light-emitting display device, a plasma display device, or the like is increasing.

SUMMARY

Embodiments provide a display device capable of realizing substantially high resolution.

A display device in embodiments of the disclosure includes a substrate including a first pixel area and a second pixel area disposed adjacent to each other, each of the first pixel area and the second pixel area including a first light-emitting area, a second light-emitting area, a third light-emitting area, and a non-light-emitting area, a light-emitting element disposed in each of the first, second, and third light-emitting areas on the substrate, a bank layer disposed in the non-light-emitting area on the light-emitting element and defining first openings respectively overlapping the first light-emitting areas of the first and second pixel areas and a first central opening extending to the first openings, and a first color conversion layer including first quantum dots and filling the first openings and the first central opening.

In an embodiment, the bank layer may further define second openings respectively overlapping the second light-emitting areas of the first and second pixel areas, third openings respectively overlapping the third light-emitting areas of the first and second pixel areas, and a second central opening extending to the second openings.

In an embodiment, a center of the first central opening may be defined on a same line as centers of the first openings in a plan view and a center of the second central opening may be defined on a same line as centers of the second openings in the plan view.

In an embodiment, a first side of the first central opening may protrude from first sides of the first openings toward a first direction and a first side of the second central opening may protrude from first sides of the second openings toward the first direction.

In an embodiment, a first side of the first central opening may protrude from first sides of the first openings toward a first direction and a first side of the second central opening may protrude from first sides of the second openings toward a direction opposite the to the first direction.

In an embodiment, the display device may further include a second color conversion layer filling the second openings and the second central opening and including second quantum dots.

In an embodiment, the display device may further include a light transmission layer filling each of the third openings. The light transmission layer may include a photosensitive organic material having light transmittance in which scattering particles are dispersed.

In an embodiment, the third openings may be spaced apart from each other in a plan view.

In an embodiment, the display device may further include a light-blocking layer disposed in the non-light-emitting area on the bank layer and partially overlapping each of the first and second central openings.

In an embodiment, the light-blocking layer may include a plurality of light-blocking patterns spaced apart from each other.

In an embodiment, each of the plurality of light-blocking patterns may have an "H" shape in a plan view.

In an embodiment, the light-blocking layer may expose an entirety of the first, second, and third openings and continuously extend in the non-light-emitting area.

In an embodiment, the display device may further include a column spacer disposed in the non-light-emitting area on the bank layer and including a same material as a material of the light-blocking layer.

In an embodiment, the bank layer may include an inorganic material or an organic material having a black color.

In an embodiment, the bank layer may further define second openings respectively overlapping the second light-emitting areas of the first and second pixel areas and a second central opening extending to the second openings. The bank layer may overlap the third light-emitting area.

In an embodiment, the bank layer may include a photosensitive organic material having light transmittance in which scattering particles are dispersed.

In an embodiment, the display device may further include a light-blocking layer disposed on the bank layer, partially overlapping each of the first and second central openings, exposing an entirety of the first and second openings, and continuously extending in the non-light-emitting area.

In an embodiment, the display device may further include a first color filter entirely overlapping the first central opening and partially overlapping the second central opening, a second color filter partially overlapping the first central opening and entirely overlapping the second central opening, and a third color filter partially overlapping each of the first and second central openings and entirely overlapping the third openings.

In an embodiment, the first light-emitting area may emit red light, the second light-emitting area may emit green light, and the third light-emitting area may emit blue light.

A display device in embodiments of the disclosure includes a substrate including a first pixel area and a second pixel area disposed adjacent to each other, each of the first pixel area and the second pixel area including a first light-emitting area that emits light of a first color, a second light-emitting area that emits light of a second color, a third light-emitting area that emits light of a third color, and a non-light-emitting area, a light-emitting element disposed in each of the first, second, and third light-emitting areas on the substrate, a bank layer disposed in the non-light-emitting area on the light-emitting element and defining first openings respectively overlapping the first light-emitting areas of the first and second pixel areas, second openings respectively overlapping the second light-emitting areas of the first and second pixel areas, third openings respectively overlapping the third light-emitting areas of the first and second pixel areas, a first central opening extending to the first openings, and a second central opening extending to the second openings, a first color conversion layer including first quantum dots and filling the first openings and the first central opening, a second color conversion layer including second quantum dots and filling the second openings and the second central opening, a light transmission layer including a photosensitive organic material having light transmittance in which scattering particles are dispersed and filling the third openings, and a light-blocking layer disposed on the bank layer and partially overlapping each of the first and second central openings.

In a display device in embodiments of the disclosure, a bank layer may be disposed in a non-light-emitting area and define openings overlapping light-emitting areas that emits red light or green light of a first pixel area and a second pixel area disposed adjacent to each other and a central opening extending to the openings. A color conversion layer including quantum dots may be filled in the openings and the central opening. That is, due to the central opening, two adjacent openings may be simultaneously filled in the color conversion layer. Accordingly, a high-resolution display device may be implemented. In addition, stains of the display device may be improved.

BRIEF DESCRIPTION OF THE DRAWINGS

Illustrative, non-limiting embodiments will be more clearly understood from the following detailed description in conjunction with the accompanying drawings.

DETAILED DESCRIPTION

Figure 1:
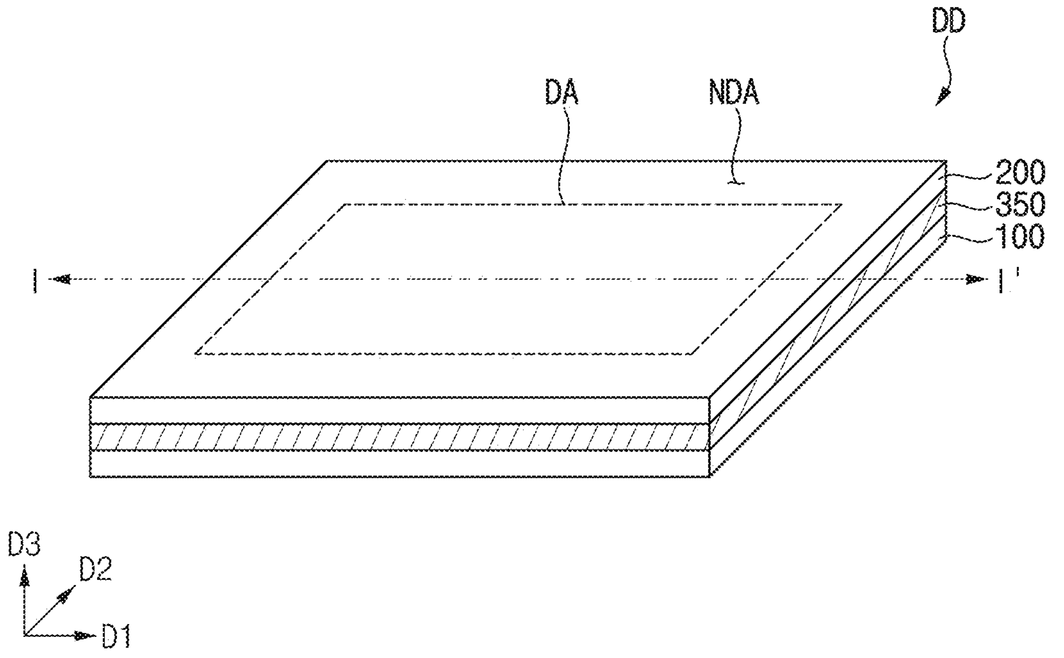
FIG. 1 is a view illustrating an embodiment of a display device according to the disclosure.

Hereinafter, a display device in embodiments of the disclosure will be explained in detail with reference to the accompanying drawings. The same reference numerals are used for the same components in the drawings, and redundant descriptions of the same components will be omitted.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term such as "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
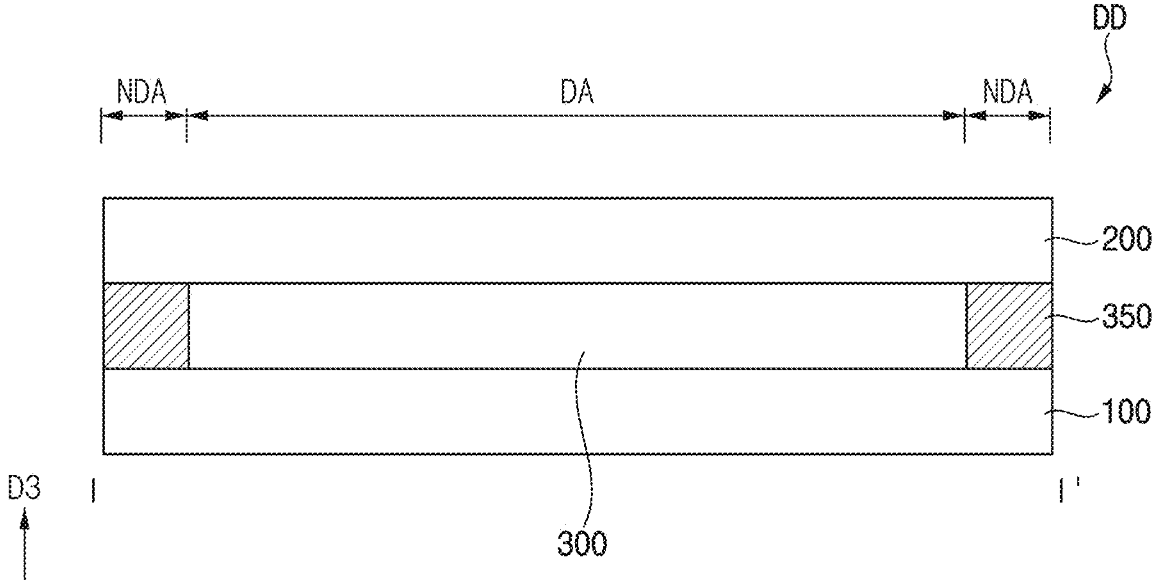
FIG. 2 is a cross-sectional view taken along line I-I' of FIG. 1.

FIG. 1 is a view illustrating an embodiment of a display device according to the disclosure. FIG. 2 is a cross-sectional view taken along line I-I' of FIG. 1.

Referring to FIGS. 1 and 2, a display device DD in an embodiment of the disclosure may include a lower structure 100, a sealing portion 350, a filling layer 300, and an upper structure 200.

The display device DD may be divided into a display area DA and a non-display area NDA. The display area DA may be defined as an area that displays an image, and the non-display area NDA may be defined as an area not that displays an image. The non-display area NDA may be disposed around the display area DA. In an embodiment, the non-display area NDA may surround the display area DA, for example.

The lower structure 100 may include a substrate, insulating layers, a transistor, and a light-emitting element. A detailed description of the lower structure 100 will be described later.

The upper structure 200 may be disposed on the lower structure 100. The upper structure 200 may face the lower structure 100. The upper structure 200 may include a color filter layer that selectively transmits light having a predetermined wavelength. A detailed description of the upper structure 200 will be described later.

The sealing portion 350 may be disposed between the lower structure 100 and the upper structure 200 in the non-display area NDA. The sealing portion 350 may be disposed along the edges of the lower structure 100 and the upper structure 200 in the non-display area NDA to surround the display area DA in a plan view. In addition, the lower structure 100 and the upper structure 200 may be coupled through the sealing portion 350. The sealing portion 350 may include an organic material. In an embodiment, the sealing portion 350 may include an epoxy resin or the like, for example. However, the disclosure is not limited thereto, and the sealing portion 350 may include various organic materials.

The filling layer 300 may be disposed between the lower structure 100 and the upper structure 200. The filling layer 300 may fill between the lower structure 100 and the upper structure 200. The filling layer 300 may include a material capable of transmitting light. In an embodiment, the filling layer 300 may include an organic material, for example. In embodiments, materials that may be used for the filling layer 300 may include silicone-based resin, epoxy-based resin, or the like. These may be used alone or in any combinations with each other. However, the disclosure is not limited thereto, and the filling layer 300 may include various organic materials. In other embodiments, the filling layer 300 may be omitted.

In this specification, a plane may be defined as a first direction D1 and a second direction D2 crossing the first direction D1. In an embodiment, the second direction D2 may be perpendicular to the first direction D1, for example. In addition, a third direction D3 may be perpendicular to the plane.

Figure 3:
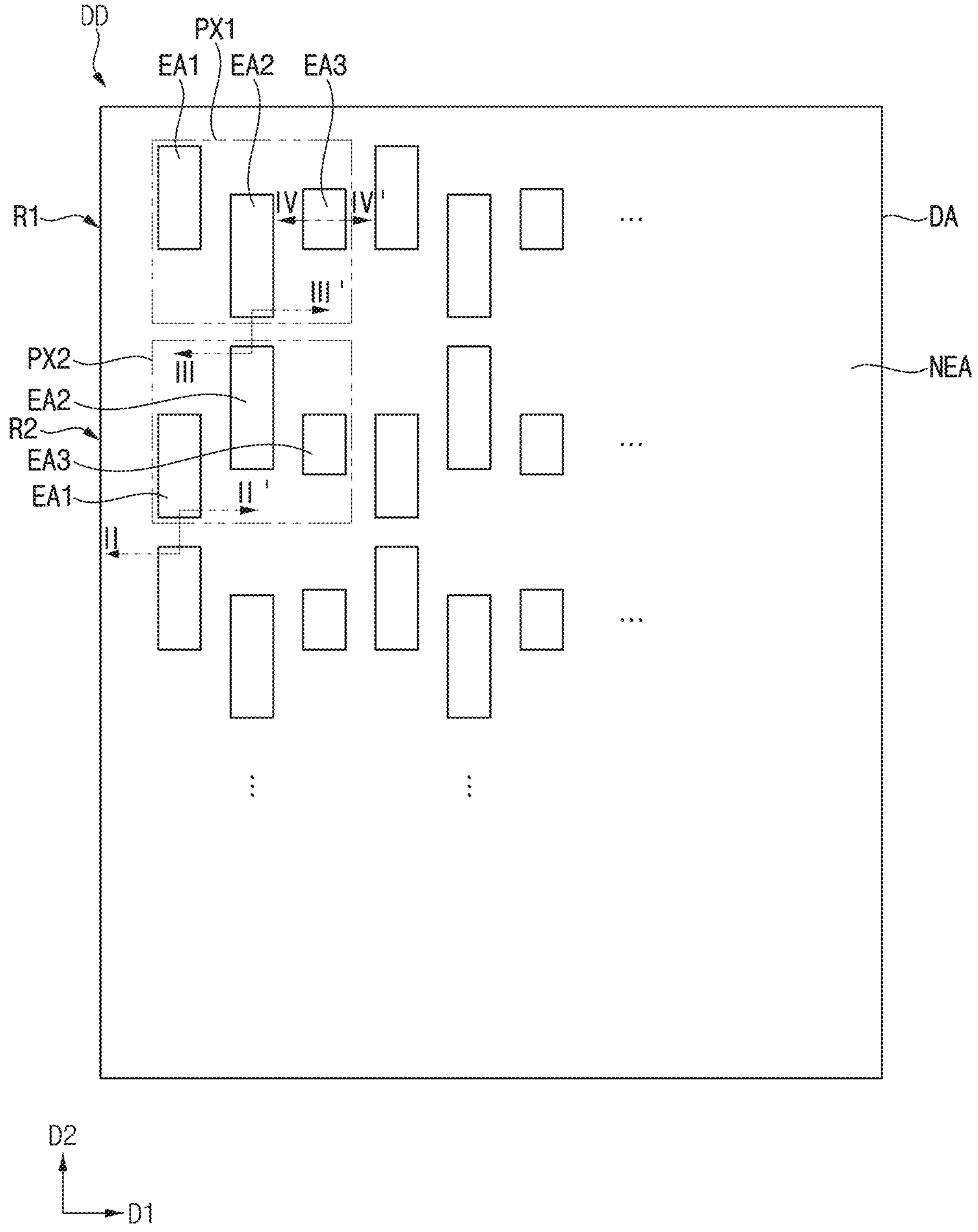
FIG. 3 is a plan view illustrating an embodiment of the display device of FIGS. 1 and 2.

FIG. 3 is a plan view illustrating an embodiment of the display device of FIGS. 1 and 2.

Referring to FIGS. 1, 2 and 3, as described above, the display device DD may be divided into the display area DA and the non-display area NDA. The display area DA may include a plurality of pixel areas. Each of the pixel areas may emit light.

The pixel areas may include a first pixel area PX1 and a second pixel area PX2. The first pixel area PX1 and the second pixel area PX2 may be adjacent to each other. In an embodiment, the first pixel area PX1 and the second pixel area PX2 may simultaneously emit light, for example. In an alternative embodiment, when the first pixel area PX1 emits light, the second pixel area PX2 may not emit light. In an alternative embodiment, when the first pixel area PX1 does not emit light, the second pixel area PX2 may emit light. As each of the pixel areas emits light, the display area DA may display an image.

The pixel areas may be repeatedly arranged along the first direction D1 and the second direction D2 crossing the first direction D1. In an embodiment, the first pixel area PX1 may be repeatedly arranged in a first row R1 along the first direction D1, and the second pixel area PX2 may be repeatedly arranged in a second row R2 adjacent to the first row R1 along the first direction D1, for example. That is, the first pixel areas PX1 may be repeatedly arranged along the first direction D1 in odd-numbered rows, and the second pixel areas PX2 may be repeatedly arranged along the first direction D1 in even-numbered rows.

Each of the first pixel area PX1 and the second pixel area PX2 may include a first light-emitting area EA1, a second light-emitting area EA2, a third light-emitting area EA3, and a non-light-emitting area NEA.

Each of the first light-emitting area EA1, the second light-emitting area EA2, and the third light-emitting area EA3 may be an area through which light emitted from a light-emitting element is emitted to the outside. The first light-emitting area EA1, the second light-emitting area EA2, and the third light-emitting area EA3 may emit light of different colors. In an embodiment, the first light-emitting area EA1 may emit light of a first color, the second light-emitting area EA2 may emit light of a second color, and the third light-emitting area EA3 may emit light of a third color, for example.

In an embodiment, the first light-emitting area EA1 may emit red light, the second light-emitting area EA2 may emit green light, and the third light-emitting area EA3 may emit blue light. However, the disclosure is not limited thereto, and in another embodiment, the first light-emitting area EA1, the second light-emitting area EA2, and the third light-emitting area EA3 may be combined to emit yellow, cyan, and magenta lights, for example.

In addition, the first light-emitting area EA1, the second light-emitting area EA2, and the third light-emitting area EA3 may emit light of four or more colors. In an embodiment, the first light-emitting area EA1, the second light-emitting area EA2, and the third light-emitting area EA3 may be combined to further emit at least one of yellow, cyan, and magenta lights in addition to red, green, and blue lights, for example. In addition, the first light-emitting area EA1, the second light-emitting area EA2, and the third light-emitting area EA3 may be combined to further emit white light.

Areas of the first light-emitting area EA1, the second light-emitting area EA2, and the third light-emitting area EA3 may be different from each other. In an embodiment, the area of the second light-emitting area EA2 that emits green light may be larger than the area of each of the first light-emitting area EA1 that emits red light and the third light-emitting area EA3 that emits blue light. In this case, the area of the first light-emitting area EA1 may be larger than the area of the third light-emitting area EA3. However, the disclosure is not limited thereto.

The non-light-emitting area NEA may be disposed between the first light-emitting area EA1, the second light-emitting area EA2, and the third light-emitting area EA3. In an embodiment, in the plan view, the non-light-emitting area NEA may surround the first light-emitting area EA1, the second light-emitting area EA2, and the third light-emitting area EA3. The non-light-emitting area NEA may not emit light, for example.

The display device DD may have a quadrangular planar shape, e.g., rectangular planar shape. In an embodiment, the display device DD may include two first sides extending in the first direction D1 and two second sides extending in the second direction D2, for example. A corner where the first side and the second side meet may be a right angle. In another embodiment, the corner where the first side and the second side of the display device DD meet may form a curved surface.

Figure 4:
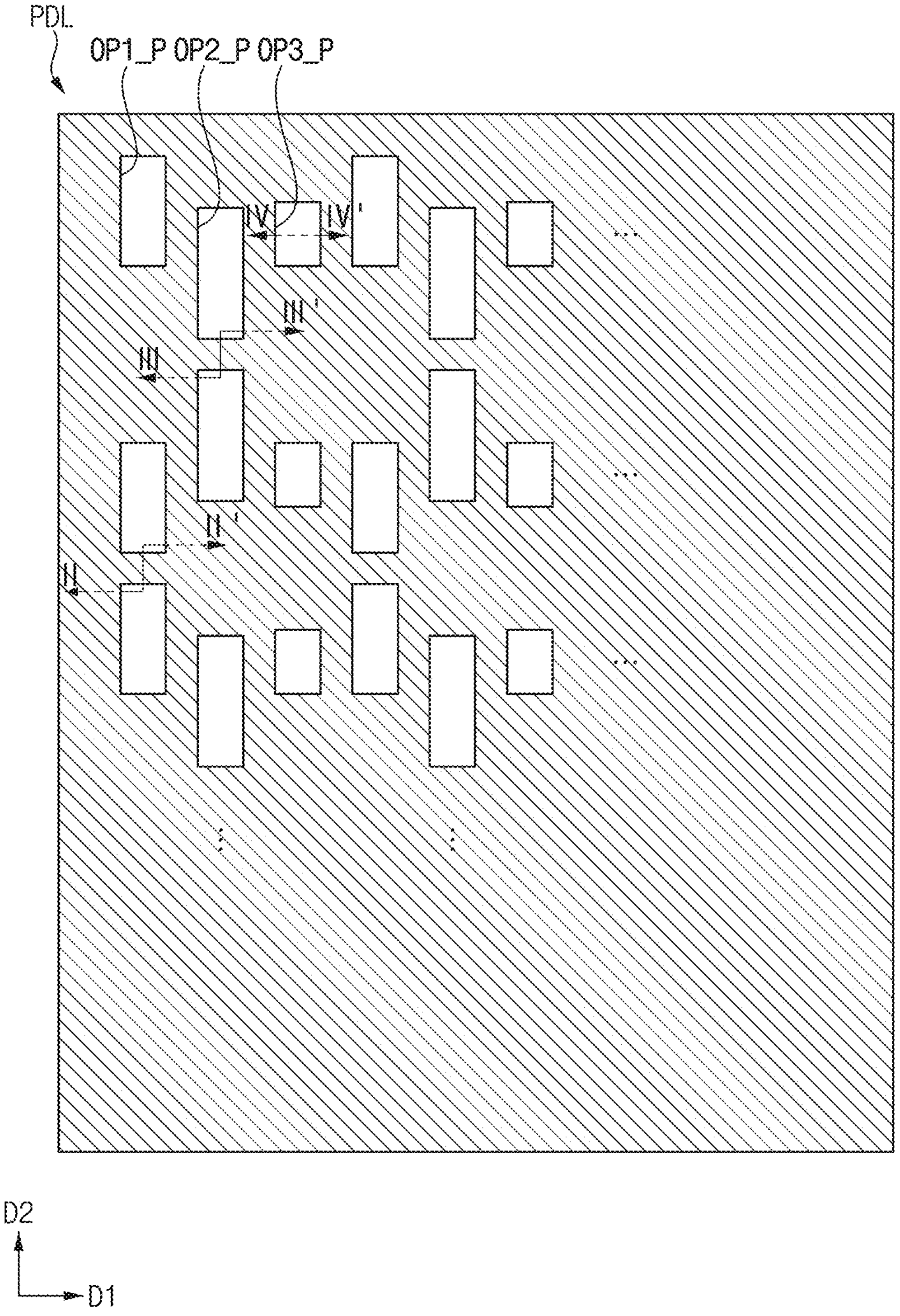
FIG. 4 is a plan view illustrating a pixel defining layer included in a lower structure of FIGS. 1 and 2.

FIG. 4 is a plan view illustrating a pixel defining layer included in a lower structure of FIGS. 1 and 2.

Referring to FIGS. 1, 2, 3, and 4, the lower structure 100 of the display device DD in an embodiment may include a pixel defining layer PDL.

In an embodiment, an opening exposing at least a part of an upper surface of a pixel electrode (e.g., pixel electrodes PE1, PE2, and PE3 of FIG. 7) may be defined in the pixel defining layer PDL. In an embodiment, a first opening OP1_P overlapping the first light-emitting area EA1, a second opening OP2_P overlapping the second light-emitting area EA2, and a third opening OP3_P overlapping the third light-emitting area EA3 may be defined in the pixel defining layer PDL, for example.

Areas of the first opening OP1_P, the second opening OP2_P, and the third opening OP3_P may be different from each other. In an embodiment, the area of the second opening OP2_P may be larger than each of the area of each of the first opening OP1_P and the area of the third opening OP3_P. In this case, the area of the first opening OP1_P may be larger than the area of the third opening OP3_P. However, the disclosure is not limited thereto.

The first opening OP1_P may have the same area as that of the first light-emitting area EA1, the second opening OP2_P may have the same area as that of the second light-emitting area EA2, and the third opening OP3_P may have the same area as that of the third light-emitting area EA3. Accordingly, the first opening OP1_P may define the first light-emitting area EA1, the second opening OP2_P may define the second light-emitting area EA2, and the third opening OP3_P may define the third light-emitting area EA3. However, the disclosure is not limited thereto. In an embodiment, the first opening OP1_P may have the area different from the area of the first light-emitting area EA1, the second opening OP2_P may have the area different from the area of the second light-emitting area EA2, and the third opening OP3_P may have the area different from the area of the third light-emitting area EA3, for example.

Figure 5:
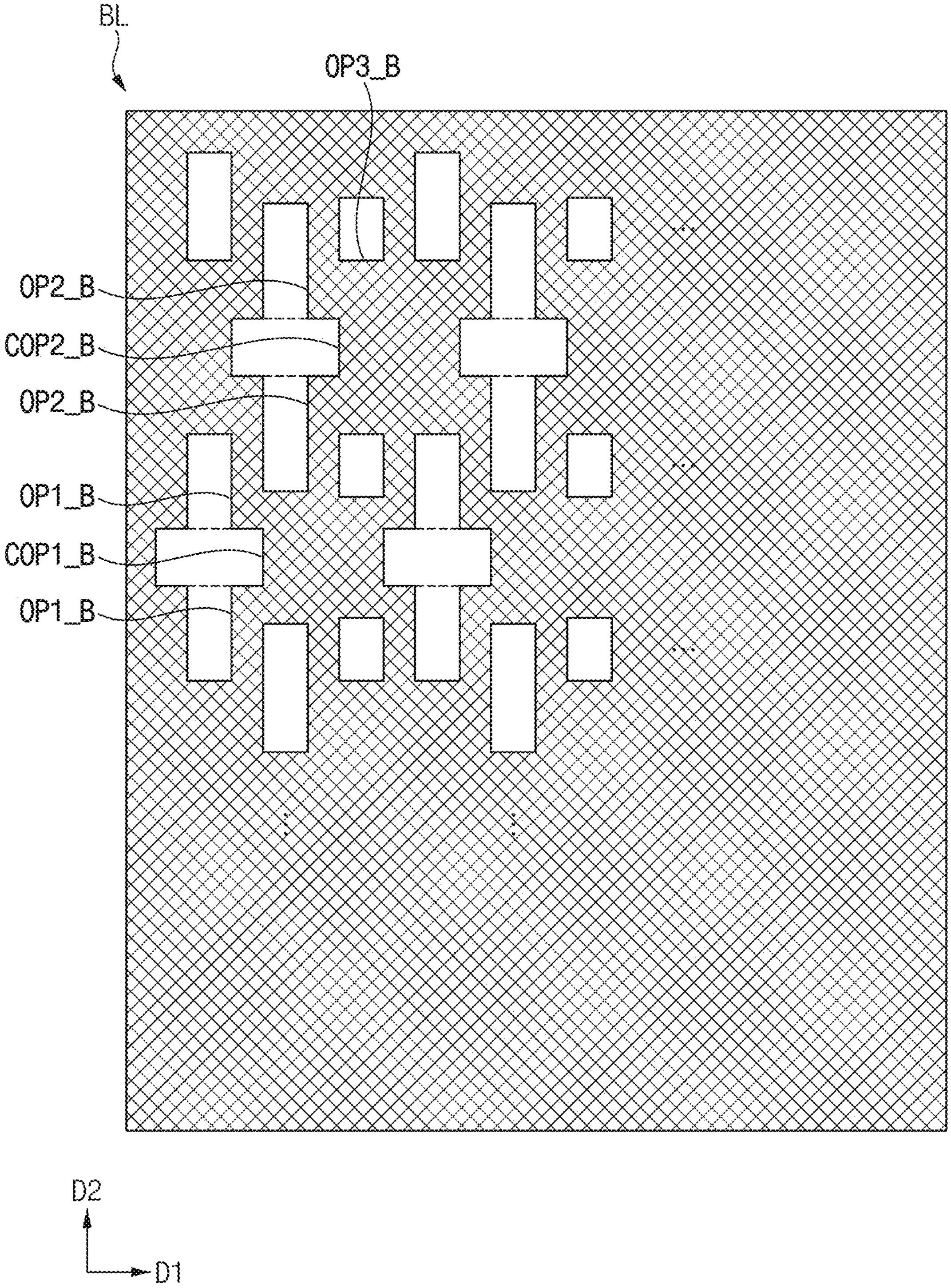
FIG. 5 is a plan view illustrating an embodiment of a bank layer included in a lower structure of FIGS. 1 and 2.
Figure 6:
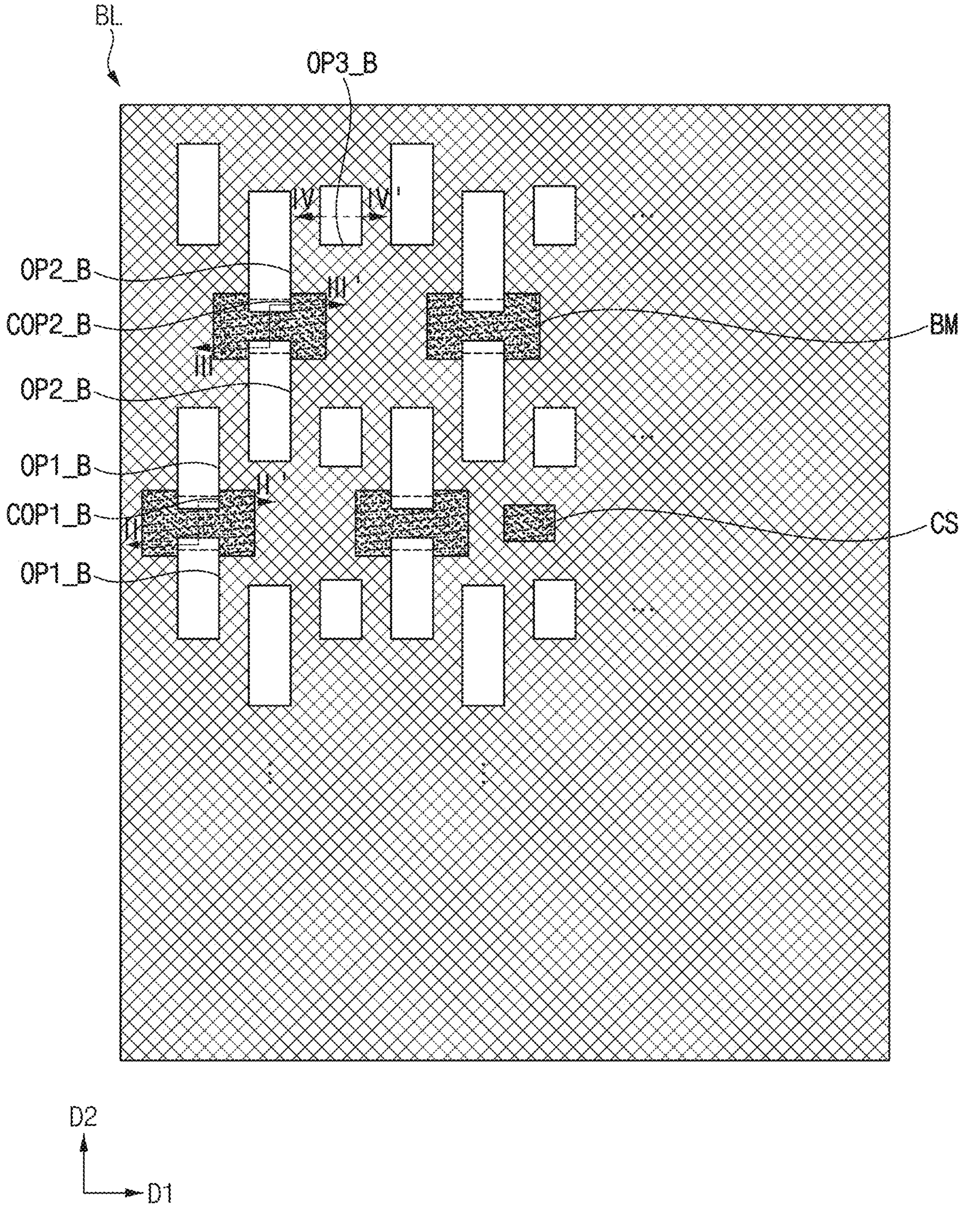
FIG. 6 is a plan view illustrating an embodiment of a bank layer and a light-blocking layer included in a lower structure of FIGS. 1 and 2

FIG. 5 is a plan view illustrating an embodiment of a bank layer included in a lower structure of FIGS. 1 and 2. FIG. 6 is a plan view illustrating an embodiment of a bank layer and a light-blocking layer included in a lower structure of FIGS. 1 and 2

Referring to FIGS. 1, 2, 3, and 5, the upper structure 200 of the display device DD in an embodiment may include a bank layer BL.

An opening filled in a material forming a color conversion layer and a light transmission layer may be defined in the bank layer BL. In an embodiment, a first opening OP1_B overlapping the first light-emitting area EA1, a second opening OP2_B overlapping the second light-emitting area EA2, and a third opening OP3_B overlapping the third light-emitting area EA3 may be defined in the bank layer BL. The first opening OP1_B may be filled in a first color conversion layer (e.g., a first color conversion layer CCL1 of FIG. 7), the second opening OP2_B may be filled in a second color conversion layer (e.g., a second color conversion layer CCL2 of FIG. 7), and the third opening OP3_B may be filled in a light transmission layer (e.g., a light transmission layer LTL of FIG. 7).

In an embodiment, a first central opening COP1_B extending to two adjacent first openings OP1_B and a second central opening COP2_B extending to two adjacent second openings OP2_B may be further defined in the bank layer BL. The first central opening COP1_B may partially overlap each of the first light-emitting area EA1 and the non-light-emitting area NEA, the second central opening COP2_B may partially overlap each of the second light-emitting area EA2 and the non-light-emitting area NEA. The first central opening COP1_B may be fill with the first color conversion layer and the second central opening COP2_B may be fill with the second color conversion layer.

In an embodiment, the third openings OP3_B may be spaced apart from each other. That is, a central opening extending to the third openings OP3_B may not be defined in the bank layer BL.

The first and second color conversion layers may be formed through an inkjet printing process. In the inkjet printing process, an ink composition, which is a material for forming the first and second color conversion layers, may be dripped into the first and second central openings COP1_B and COP2_B. In this case, the ink composition dropped into the first central opening COP1_B may be diffused to the first openings OP1_B adjacent to each other, and the ink composition dropped into the second central opening COP2_B may be diffused into the second openings OP2_B adjacent to each other. Accordingly, a high-resolution display device DD may be implemented.

In an embodiment, the center of the first central opening COP1_B may be defined on the same line as the center of the first openings OP1_B adjacent to the first central opening COP1_B in the plan view. In addition, the center of the second central opening COP2_B may be defined on the same line as the center of the second openings OP2_B adjacent to the second central opening COP2_B in the plan view. However, the disclosure is not limited thereto.

Further referring to FIG. 6, the upper structure 200 of the display device DD in an embodiment may further include a light-blocking layer BM.

The light-blocking layer BM may be disposed on the bank layer BL. The light-blocking layer BM may overlap the non-light-emitting area NEA. Specifically, the light-blocking layer BM may overlap a part of the non-light-emitting area NEA. In an embodiment, the light-blocking layer BM may include a plurality of light-blocking patterns spaced apart from each other. One of the light-blocking patterns may partially overlap the first central opening COP1_B, and another of the light-blocking patterns may partially overlap the second central opening COP2_B.

Each of the light-blocking patterns may have various planar shapes. In an embodiment, each of the light-blocking patterns may have an "H" shape in the plan view. However, the disclosure is not limited thereto.

In an embodiment, the display device DD may further include a column spacer CS disposed on the bank layer BL. The column spacer CS may include the same material as that of the light-blocking layer BM. That is, the column spacer CS may be formed through the same process as the light-blocking layer BM. The column spacer CS may maintain a constant gap between the lower structure 100 and the upper structure 200. In other embodiments, the column spacer CS may be omitted.

Figure 7:
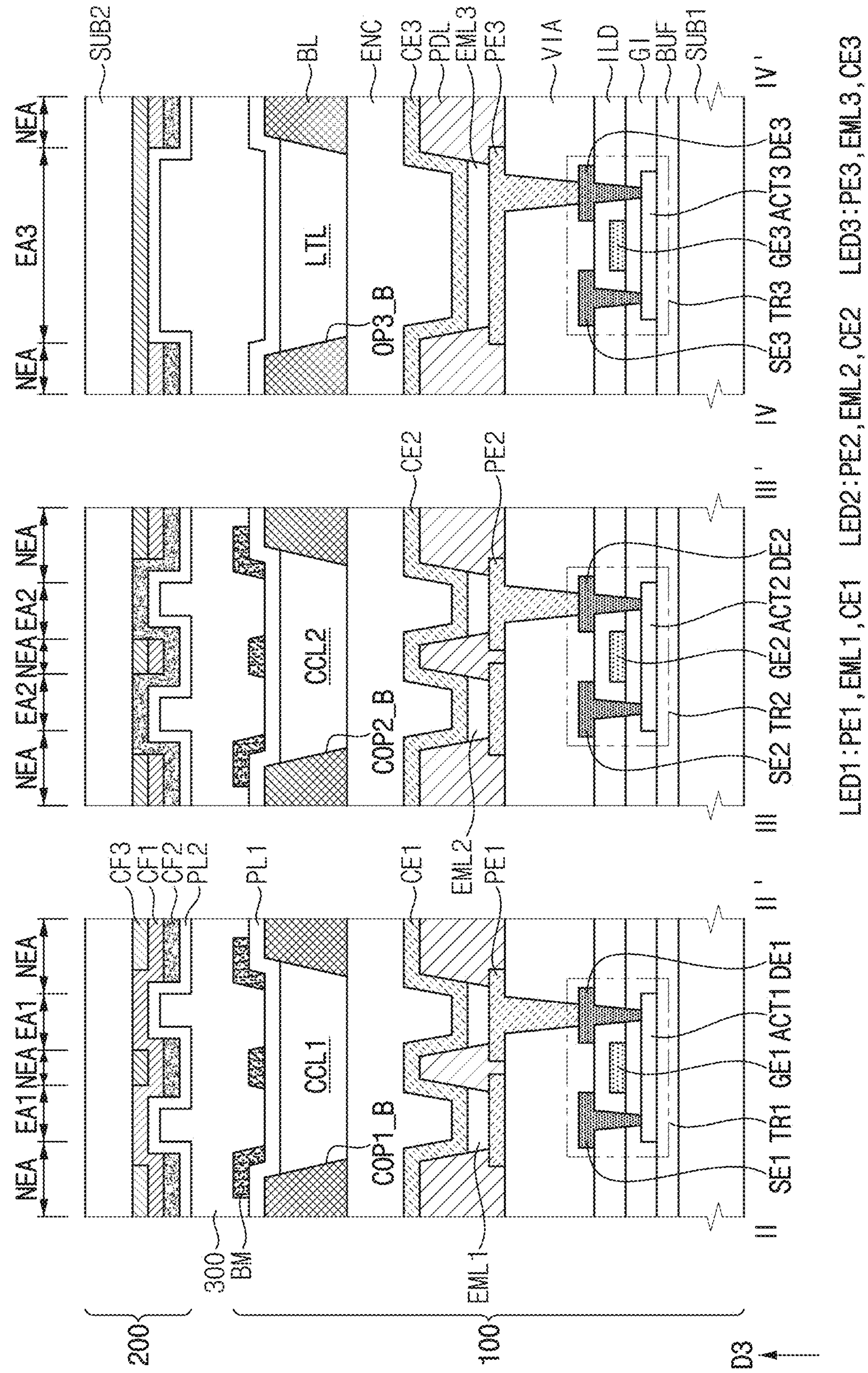
FIG. 7 is a cross-sectional view taken along lines II-II', III-III', and IV-IV' of FIGS. 3, 4, and 6.

FIG. 7 is a cross-sectional view taken along lines II-II', III-III', and IV-IV' of FIGS. 3, 4, and 6.

Referring to FIG. 7, the display device DD in an embodiment may include the lower structure 100, the filling layer 300, and the upper structure 200. First, the lower structure 100 will be described.

The lower structure 100 includes a first substrate SUB1, a buffer layer BUF, first, second, and third transistors TR1, TR2, and TR3, a gate insulating layer GI, an inter-insulating layer ILD, a via-insulating layer VIA, a pixel defining layer PDL, first, second, and third light-emitting elements LED1, LED2, and LED3, an encapsulation layer ENC, the bank layer BL, the first and second color conversion layers CCL1 and CCL2, the light transmission layer LTL, a first passivation layer PL1, and a light-blocking layer BM.

As described above, the display device DD may be divided into the display area DA and the non-display area NDA, and the display area DA may include the first pixel area PX1 and the second pixel area PX2. As the display area DA of the display device DD includes the first pixel area PX1 and the second pixel area PX2, the first substrate SUB1 may include the first pixel area PX1 and the second pixel area PX2.

The first substrate SUB1 may include a transparent material or an opaque material.

The first substrate SUB1 may include or consist of a transparent resin substrate. In embodiments, the transparent resin substrate may include polyimide substrates or the like. In this case, the polyimide substrate may include a first organic layer, a first barrier layer, a second organic layer, or the like. In an alternative embodiment, the first substrate SUB1 may include a quartz substrate, a synthetic quartz substrate, a calcium fluoride substrate, an F-doped quartz substrate, soda-lime glass substrate, non-alkali glass substrate, or the like. These may be used alone or in any combinations with each other.

The buffer layer BUF may be disposed on the first substrate SUB1. The buffer layer BUF may prevent diffusion of metal atoms or impurities from the first substrate SUB1 to the first, second, and third transistors TR1, TR2, and TR3. In addition, the buffer layer BUF may improve the flatness of the surface of the first substrate SUB1 when the surface of the first substrate SUB1 is not uniform. In an embodiment, the buffer layer BUF may include an inorganic material such as silicon oxide, silicon nitride, silicon oxynitride, or the like, for example. These may be used alone or in any combinations with each other.

First, second, and third active patterns ACT1, ACT2, and ACT3 may be disposed on the buffer layer BUF. Each of the first, second, and third active patterns ACT1, ACT2, and ACT3 may include a metal oxide semiconductor, an inorganic semiconductor (e.g., amorphous silicon, poly silicon), or an organic semiconductor. Each of the first, second, and third active patterns ACT1, ACT2, and ACT3 may include a source region, a drain region, and a channel region disposed between the source region and the drain region. The first, second, and third active patterns ACT1, ACT2, and ACT3 may be formed through the same process and include the same material.

The metal oxide semiconductor may include a two-component compound ($AB_x$), a ternary compound ($AB_xC_y$), a four-component compound ($AB_xC_yD_z$), or the like including or consisting of indium (In), zinc (Zn), gallium (Ga), tin (Sn), titanium (Ti), aluminum (Al), hafnium (Hf), zirconium (Zr), magnesium (Mg), or the like. In an embodiment, the metal oxide semiconductor may include zinc oxide ($ZnO_x$), gallium oxide ($GaO_x$), tin oxide ($SnO_x$), indium oxide ($InO_x$), indium gallium oxide ("IGO"), indium zinc oxide ("IZO"), indium tin oxide. ("ITO"), indium zinc tin oxide ("IZTO"), indium gallium zinc oxide ("IGZO"), or the like, for example. These may be used alone or in any combinations with each other.

The gate insulating layer GI may be disposed on the buffer layer BUF. The gate insulating layer GI may sufficiently cover the first, second, and third active patterns ACT1, ACT2, and ACT3, and may have a substantially flat upper surface without creating a step around the first, second, and third active patterns ACT1, ACT2, and ACT3. In an alternative embodiment, the gate insulating layer GI may cover the first, second, and third active patterns ACT1, ACT2, and ACT3 and may be disposed along the profile of each of the first, second, and third active patterns ACT1, ACT2, and ACT3 to have a uniform thickness. In an embodiment, the gate insulating layer GI may include an inorganic material such as silicon oxide ($SiO_x$), silicon nitride ($SiN_x$), silicon carbide ($SiC_x$), silicon oxynitride ($SiO_xN_y$), silicon oxycarbide ($SiO_xC_y$), or the like, for example. These may be used alone or in any combinations with each other.

First, second, and third gate electrodes GE1, GE2, and GE3 may be disposed on the gate insulating layer GI. The first gate electrode GE1 may overlap the channel region of the first active pattern ACT1, the second gate electrode GE2 may overlap the channel region of the second active pattern ACT2, and the third gate electrode GE3 may overlap the channel region of the third active pattern ACT3.

Each of the first, second, and third gate electrodes GE1, GE2, and GE3 may include a metal, an alloy metal nitride, a conductive metal oxide, a transparent conductive material, or the like. In embodiments, the metal may include silver (Ag), molybdenum (Mo), aluminum (Al), tungsten (W), copper (Cu), nickel (Ni), chromium (Cr), titanium (Ti), tantalum (Ta), platinum (Pt), scandium (Sc), or the like. In embodiments, the conductive metal oxide may include indium tin oxide and indium zinc oxide. In addition, embodiments of the metal nitride may include aluminum nitride ($AlN_x$), tungsten nitride ($WN_x$), chromium nitride ($CrN_x$), or the like. These may be used individually or in any combinations with each other.

The first, second, and third gate electrodes GE1, GE2, and GE3 may be formed through the same process and include the same material.

The inter-insulating layer ILD may be disposed on the gate insulating layer GI. The inter-insulating layer ILD may sufficiently cover the first, second, and third gate electrodes GE1, GE2, and GE3 and may have a substantially flat upper surface without creating a step around the first, second, and third gate electrodes GE1, GE2, and GE3. In an alternative embodiment, the inter-insulating layer ILD may cover the first, second, and third gate electrodes GE1, GE2, and GE3 and may be disposed along the profile of each of the first, second, and third gate electrodes GE1, GE2, and GE3. In an embodiment, the inter-insulating layer ILD may include an inorganic material such as silicon oxide, silicon nitride, silicon carbide, silicon oxynitride, silicon oxycarbide, or the like, for example. These may be used alone or in any combinations with each other.

First, second, and third source electrodes SE1, SE2, and SE3 may be disposed on the inter-insulating layer ILD. The first source electrode SE1 may be connected to the source region of the first active pattern ACT1 through a contact hole penetrating the gate insulating layer GI and the inter-insulating layer ILD. The second source electrode SE2 may be connected to the source region of the second active pattern ACT2 through a contact hole penetrating the gate insulating layer GI and the inter-insulating layer ILD. The third source electrode SE3 may be connected to the source region of the third active pattern ACT3 through a contact hole penetrating the gate insulating layer GI and the inter-insulating layer ILD.

First, second, and third drain electrodes DE1, DE2, and DE3 may be disposed on the inter-insulating layer ILD. The first drain electrode DE1 may be connected to the drain region of the first active pattern ACT1 through a contact hole penetrating the gate insulating layer GI and the inter-insulating layer ILD. The second drain electrode DE2 may be connected to the drain region of the second active pattern ACT2 through a contact hole penetrating the gate insulating layer GI and the inter-insulating layer ILD. The third drain electrode DE3 may be connected to the drain region of the third active pattern ACT3 through a contact hole penetrating the gate insulating layer GI and the inter-insulating layer ILD.

In an embodiment, each of the first, second, and third source electrodes SE1, SE2, and SE3 may include a metal, an alloy, a metal nitride, a conductive metal oxide, a transparent conductive material, or the like, for example. These may be used alone or in any combinations with each other. The first, second, and third drain electrodes DE1, DE2, and DE3 may be formed through the same process as the first, second, and third source electrodes SE1, SE2, and SE3 and may include the same material.

Accordingly, the first transistor TR1 including the first active pattern ACT1, the first gate electrode GE1, the first source electrode SE1, and the first drain electrode DE1 may be disposed on the first substrate SUB1, the second transistor TR2 including the second active pattern ACT2, the second gate electrode GE2, the second source electrode SE2, and the second drain electrode DE2 may be disposed on the first substrate SUB1, and the third transistor TR3 including the third active pattern ACT3, the third gate electrode GE3, the third source electrode SE3, and the third drain electrode DE3 may be disposed on the first substrate SUB1.

The via-insulating layer VIA may be disposed on the inter-insulation layer ILD. The via-insulating layer VIA may sufficiently cover the first, second, and third source electrodes SE1, SE2, and SE3 and the first, second, and third drain electrodes DE1, DE2, and DE3. The via-insulating layer VIA may include an organic material. In an embodiment, the via-insulating layer VIA may an organic material such as phenolic resin, polyacrylates resin, polyimides rein, polyamides resin, siloxane resin, epoxy resin, or the like, for example. These may be used alone or in any combinations with each other.

First, second, and third pixel electrodes PE1, PE2, and PE3 may be disposed on the via-insulating layer VIA. The first pixel electrode PE1 may overlap the first light-emitting area EA1, the second pixel electrode PE2 may overlap the second light-emitting area EA2, and the third pixel electrode PE3 may overlap the third light-emitting area EA3. The first pixel electrode PE1 may be connected to the first drain electrode DE1 through a contact hole penetrating the via-insulating layer VIA, the second pixel electrode PE2 may be connected to the second drain electrode DE2 through a contact hole penetrating the via-insulating layer VIA, and the third pixel electrode PE3 may be connected to the third drain electrode DE3 through a contact hole penetrating the via-insulating layer VIA.

In an embodiment, each of the first, second, and third pixel electrodes PE1, PE2, and PE3 may include a metal, an alloy, a metal nitride, a conductive metal oxide, a transparent conductive material, or the like, for example. These may be used alone or in any combinations with each other. In an embodiment, each of the first, second, and third pixel electrodes PE1, PE2, and PE3 may have a stacked structure including ITO/Ag/ITO. The first, second, and third pixel electrodes PE1, PE2, and PE3 may be formed through the same process and include the same material. In an embodiment, each of the first, second, and third pixel electrodes PE1, PE2, and PE3 may function as an anode, for example.

The pixel defining layer PDL may be disposed on the via-insulating layer VIA. The pixel defining layer PDL may overlap the light-blocking area BA. The pixel defining layer PDL may cover an edge of each of the first, second, and third pixel electrodes PE1, PE2, and PE3. In addition, an opening (e.g., the first, second, and third openings OP1_P, OP2_P, OP3_P of FIG. 4) exposing at least a part of the upper surface of each of the first, second, and third pixel electrodes PE1, PE2, and PE3 may be defined in the pixel defining layer PDL. In an embodiment, the pixel defining layer PDL may include an inorganic material or an organic material, for example. In an embodiment, the pixel defining layer PDL may include an organic material such as an epoxy resin, a siloxane resin, or the like. These may be used alone or in any combinations with each other. In another embodiment, the pixel defining layer PDL may further include a light-blocking material having a black color.

The first light-emitting layer EML1 may be disposed on the first pixel electrode PE1, the second light-emitting layer EML2 may be disposed on the second pixel electrode PE2, and the third light-emitting layer EML3 may be disposed on the third pixel electrode PE3. Specifically, the first light-emitting layer EML1 may be disposed in the first opening (e.g., the first opening OP1_P of FIG. 4) of the pixel defining layer PDL, the second light-emitting layer EML2 may be disposed in the second opening (e.g., the second opening OP2_P of FIG. 4) of the pixel defining layer PDL, and the third light-emitting layer EML3 may be disposed in the third opening (e.g., the third opening OP3_P of FIG. 4) of the pixel defining layer PDL.

Each of the first, second, and third light-emitting layers EML1, EML2, and EML3 may include an organic material that emits light of a predetermined color. In an embodiment, each of the first, second, and third light-emitting layers EML1, EML2, and EML3 may include an organic material that emits blue light.

A first common electrode CE1 may be disposed on the first light-emitting layer EML1 and the pixel defining layer PDL, a second common electrode CE2 may be disposed on the second light-emitting layer EML2 and the pixel defining layer PDL, and a third common electrode CE3 may be disposed on the third light-emitting layer EML3 and the pixel defining layer PDL. The first, second, and third common electrodes CE1, CE2, and CE3 may be unitary with each other. In an embodiment, each of the first, second, and third common electrodes CE1, CE2, and CE3 may include a metal, an alloy, a metal nitride, a conductive metal oxide, a transparent conductive material, or the like, for example. These may be used alone or in any combinations with each other. The first, second, and third common electrodes CE1, CE2, and CE3 may operate as cathode.

Accordingly, the first light-emitting element LED1 including the first pixel electrode PE1, the first light-emitting layer EML1, and the first common electrode CE1 may be disposed in the first light-emitting area EA1 on the first substrate SUB1, the second light-emitting element LED2 including the second pixel electrode PE2, the second light-emitting layer EML2, and the second common electrode CE2 may be disposed in the second light-emitting area EA2 on the first substrate SUB1, and the third light-emitting element LED3 including the third pixel electrode PE3, the third light-emitting layer EML3, and the third common electrode CE3 may be disposed in the third light-emitting area EA3 on the first substrate SUB1. Each of the first, second, and third light-emitting devices LED1, LED2, and LED3 may emit blue light.

The first light-emitting element LED1 may be electrically connected to the first transistor TR1, the second light-emitting element LED2 may be electrically connected to the second transistor TR2, and the third light-emitting element LED3 may be electrically connected to the third transistor TR3.

The encapsulation layer ENC may be disposed on the first, second, and third common electrodes CE1, CE2, and CE3. The encapsulation layer ENC may prevent impurities, moisture, air, or the like from permeating the first, second, and third light-emitting elements LED1, LED2, and LED3 from the outside. The encapsulation layer ENC may include at least one inorganic layer and at least one organic layer. In an embodiment, the inorganic layer may include silicon oxide, silicon nitride, silicon oxynitride, or the like, for example. These may be used alone or in any combinations with each other. The organic layer may include a polymer cured material such as polyacrylate or the like.

The bank layer BL may be disposed on the encapsulation layer ENC. The bank layer BL may overlap the non-light-emitting area NEA. A space capable of accommodating materials forming the first color conversion layer CCL1, the second color conversion layer CCL2, and the light transmission layer LTL may be formed in the bank layer BL. In an embodiment, the first opening (e.g., the first opening OP1_B of FIG. 5) overlapping the first light-emitting area EA1, the second opening (e.g., the second opening OP2_B of FIG. 5) overlapping the second light-emitting area EA2, and the third opening OP3_B overlapping the third light-emitting area EA3 may be defined in the bank layer BL. In addition, the first central opening COP1_B extending to adjacent first openings and the second central opening COP2_B extending to adjacent second openings may be further defined in the bank layer BL. The first opening, the second opening, the third opening OP3_B, the first central opening COP1_B, and the second central opening COP2_B may accommodate the material.

The bank layer BL may include an inorganic material and/or an organic material. In an embodiment, the bank layer BL may include an organic material such as polyimide, for example. In an alternative embodiment, the bank layer BL may include an inorganic material and/or an organic material including or consisting of a light-blocking material having black color.

The first color conversion layer CCL1, the second color conversion layer CCL2, and the light transmission layer LTL may be disposed on the encapsulation layer ENC. The first color conversion layer CCL1 may overlap the first light-emitting area EA1, the second color conversion layer CCL2 may overlap the second light-emitting area EA2, and the light transmission layer LTL may overlap the third light-emitting area EA3. In addition, the first color conversion layer CCL1 may further overlap a part of the non-light-emitting area NEA disposed between the adjacent first light-emitting areas EA1 and the second color conversion layer CCL2 may further overlap a part of the non-light-emitting area NEA disposed between the second light-emitting areas EA2 adjacent to each other.

In an embodiment, the first color conversion layer CCL1 may be disposed to fill the first opening and the first central opening COP1_B of the bank layer BL, the second color conversion layer CCL2 may be disposed to fill the second opening and the second central opening COP2_B of the bank layer BL, and the light transmission layer LTL may be disposed to fill the third opening OP3_B of the bank layer BL. Accordingly, the first color conversion layer CCL1 may have the same planar shape as that of the first opening and the first central opening COP1_B, the second color conversion layer CCL2 may have the second opening and the second central opening COP2_B, and the light transmission layer LTL may have the same planar shape as that of the third opening OP3_B.

Figure 8:
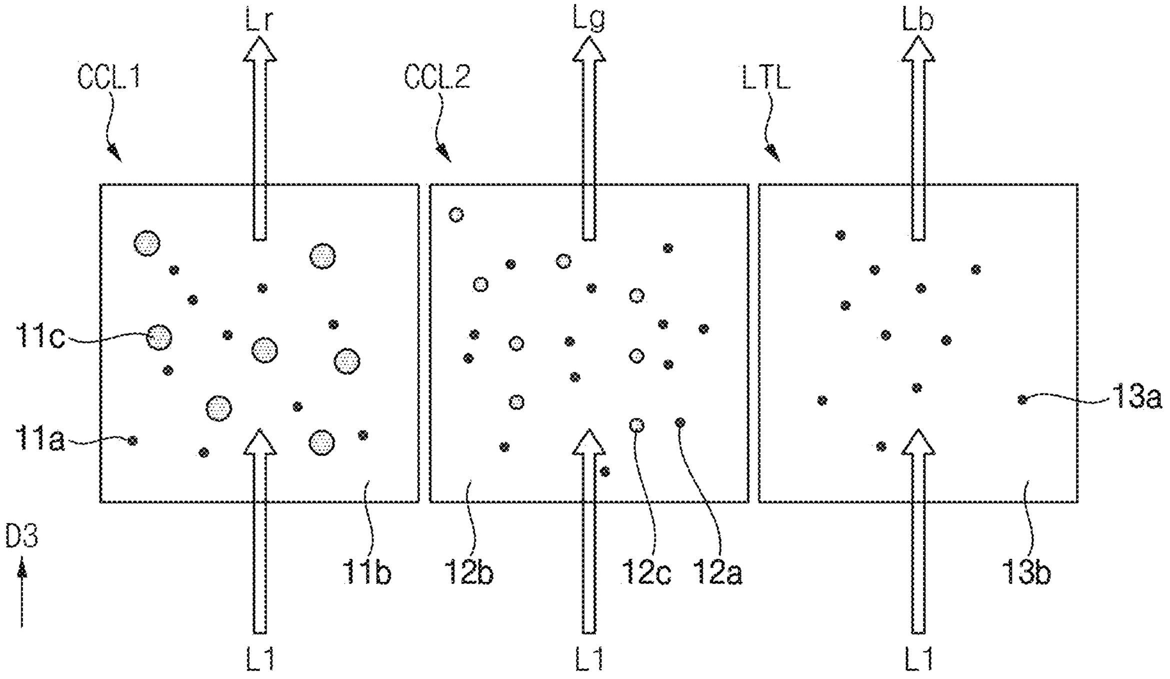
FIG. 8 is a cross-sectional view illustrating a first color conversion layer, a second color conversion layer, and a light transmission layer of the display device of FIG. 7.

FIG. 8 is a cross-sectional view illustrating a first color conversion layer, a second color conversion layer, and a light transmission layer of the display device of FIG. 7.

Referring further to FIG. 8, the first color conversion layer CCL1 may include first quantum dots 11*c* excited by light L1 emitted from the first light-emitting element LED1 to emit light of a first color (e.g., red light Lr). In addition, the first color conversion layer CCL1 may further include a first base resin 11*b* in which first scattering particles 11*a* are dispersed.

The second color conversion layer CCL2 may include second quantum dots 12*c* excited by the light L1 emitted from the second light-emitting element LED2 to emit light of a second color (e.g., green light Lg). In addition, the second color conversion layer CCL2 may further include a second base resin 12*b* in which second scattering particles 12*a* are dispersed.

The light transmission layer LTL may emit blue light Lb by transmitting the light L1 emitted from the third light-emitting element LED3. In addition, the light transmission layer LTL may include a third base resin 13*b* in which third scattering particles 13*a* are dispersed.

In an embodiment, each of the first, second, and third base resins 11*b*, 12*b*, and 13*b* may include an organic material having relatively high light transmittance such as photoresist, silicon resin, epoxy resin, or the like, for example. These may be used alone or in any combinations with each other. In an embodiment, the third base resin 13*b* may include a photosensitive organic material having relatively high light transmittance. However, the disclosure is not limited thereto.

In an embodiment, the first, second, and third scattering particles 11*a*, 12*a*, and 13*a* may scatter and emit light emitted from the first, second, and third light-emitting elements LED1, LED2, and LED3, for example. In addition, the first, second, and third scattering particles 11_a_, 12_a_, and 13_a_ may include the same material as each other.

Accordingly, the first light-emitting area EA1 may emit the red light Lr, the second light-emitting area EA2 may emit the green light Lg, and the third light-emitting area EA3 may emit the blue light Lb.

In an embodiment, the first and second color conversion layers CCL1 and CCL2 may be formed through an inkjet printing process, and the light transmission layer LTL may be formed through a photolithography process. However, the disclosure is not limited thereto.

Referring back to FIG. 7, the first passivation layer PL1 may be disposed on the first color conversion layer CCL1, the second color conversion layer CCL2, the light transmission layer LTL, and the bank layer BL. The first passivation layer PL1 may be disposed along the profiles of the first color conversion layer CCL1, the second color conversion layer CCL2, the light transmission layer LTL, and the bank layer BL. The first passivation layer PL1 may perform a moisture permeation prevention role to prevent deterioration of the first color conversion layer CCL1, the second color conversion layer CCL2, and the light transmission layer LTL. In an embodiment, the first passivation layer PL1 may include an inorganic material such as silicon oxide, silicon nitride, silicon oxynitride, or the like, for example. These may be used alone or in any combinations with each other.

The light-blocking layer BM may be disposed on the first passivation layer PL1. The light-blocking layer BM may overlap the non-light-emitting area NEA. Specifically, the light-blocking layer BM may overlap a part of the non-light-emitting area NEA. That is, the first and second light-emitting areas EA1 and EA2 may be defined by the light-blocking layer BM. In addition, the light-blocking layer BM may block light leakage.

The light-blocking layer BM may include an inorganic material and/or an organic material. In an embodiment, the light-blocking layer BM may include an organic material such as polyimide or the like, for example. In an alternative embodiment, the light-blocking layer BM may include an inorganic material and/or an organic material including or consisting of a light-blocking material having black color.

Hereinafter, the upper structure 200 will be described.

The upper structure 200 may include a second substrate SUB2, first, second, and third color filters CF1, CF2, and CF3, and a second passivation layer PL2.

The second substrate SUB2 may include or consist of a transparent resin substrate. The second substrate may transmit light emitted from the first, second, and third light-emitting devices LED1, LED2, and LED3. In an embodiment, the second substrate SUB2 may include an insulating material such as glass or plastic, for example. In an alternative embodiment, the second substrate SUB2 may include an organic polymer material such as polycarbonate ("PC"), polyethylene ("PE"), polypropylene ("PP"), or the like. These may be used alone or in any combinations with each other.

A color filter layer may be disposed under the second substrate SUB2. The color filter layer may selectively transmit light having a predetermined wavelength. The color filter layer may include the first color filter CF1, the second color filter CF2, and the third color filter CF3.

The first color filter CF1 may selectively transmit light of a first color (e.g., the red light Lr). The first color filter CF1 may overlap the first light-emitting area EA1 and the non-light-emitting area NEA. In this case, the first color filter CF1 may not overlap the second and third light-emitting areas EA2 and EA3. In an embodiment, the first color filter CF1 may entirely overlap the first central opening COP1_B and partially overlap the second central opening COP2_B.

The second color filter CF2 may selectively transmit second color light (e.g., the green light Lg). The second color filter CF2 may overlap the second light-emitting area EA2 and the non-light-emitting area NEA. In this case, the second color filter CF2 may not overlap the first and third light-emitting areas EA1 and EA3. In an embodiment, the second color filter CF2 may partially overlap the first central opening COP1_B and entirely overlap the second central opening COP2_B.

The third color filter CF3 may selectively transmit third color light (e.g., the blue light Lb). The third color filter CF3 may overlap the third light-emitting area EA3 and the non-light-emitting area NEA. In this case, the third color filter CF3 may not overlap the first and second light-emitting areas EA1 and EA2. In an embodiment, the third color filter CF3 partially overlaps each of the first and second central openings COP1_B and COP2_B, and entirely overlap the third opening OP3_B.

The second passivation layer PL2 may be disposed under the color filter layer. The second passivation layer PL2 may block external impurities to prevent contamination of the color filter layer. In an embodiment, the second passivation layer PL2 may include an inorganic material such as silicon oxide, silicon nitride, silicon oxynitride, or the like, for example. These may be used alone or in any combinations with each other.

The filling layer 300 may be disposed between the lower structure 100 and the upper structure 200. That is, the filling layer 300 may fill an empty space between the lower structure 100 and the upper structure 200.

However, although the display device DD of the disclosure is limited to an organic light-emitting display device ("OLED"), the disclosure is not limited thereto. In an embodiment, the display device DD may include a liquid crystal display device ("LCD"), a field emission display device ("FED"), a plasma display device ("PDP"), or an electrophoretic display device ("EPD"), for example.

In addition, although the bank layer BL, the first color conversion layer CCL1, the second color conversion layer CCL2, the light transmission layer LTL, and the light-blocking layer BM is illustrated as being included in the lower structure 100 in FIG. 7, the disclosure is not limited thereto. In an alternative embodiment, the bank layer BL, the first color conversion layer CCL1, the second color conversion layer CCL2, the light transmission layer LTL, and the light-blocking layer BM may be included in the upper structure 200.

In the display device DD in embodiments of the disclosure, the bank layer BL may be disposed in the non-light-emitting area NEA and define the first openings OP1_B overlapping the first light-emitting areas EA1 that emits red light of the first pixel area PX1 and the second pixel area PX2 disposed adjacent to each other and the first central opening COP1_B extending to the first openings OP1_B. In addition, the bank layer BL may further define the second openings OP2_B overlapping the second light-emitting areas EA2 that emits green light of the first pixel area PX1 and the second pixel area PX2 disposed adjacent to each other and the second central opening COP2_B extending to the second openings OP2_B. The first color conversion layer CCL1 including quantum dots may be filled in the first openings OP1_B and the first central opening COP1_B. The second color conversion layer CCL2 including quantum dots may be filled in the second openings OP2_B and the second central opening COP2_B. That is, due to the central opening, two adjacent openings may be simultaneously filled in the color conversion layer. Accordingly, a high-resolution display device DD may be implemented. In addition, stains of the display device DD may be improved.

FIGS. 9, 10, 11, and 12 are plan views illustrating other embodiments of the bank layer of FIG. 5.

Hereinafter, descriptions overlapping with those of the bank layer BL described with reference to FIG. 5 will be omitted or simplified.

Referring to FIGS. 9, 10, 11, and 12, the first opening OP1_B, the second opening OP2_B, the third opening OP3_B, the first central opening COP1_B, and the second central opening COP2_B may be defined in the bank layer BL. The first central opening COP1_B may extend to the two adjacent first openings OP1_B, and the second central opening COP2_B may extend to the two adjacent second openings OP2_B. Each of the first central opening COP1_B and the second central opening COP2_B may have various shapes.

Figure 9:
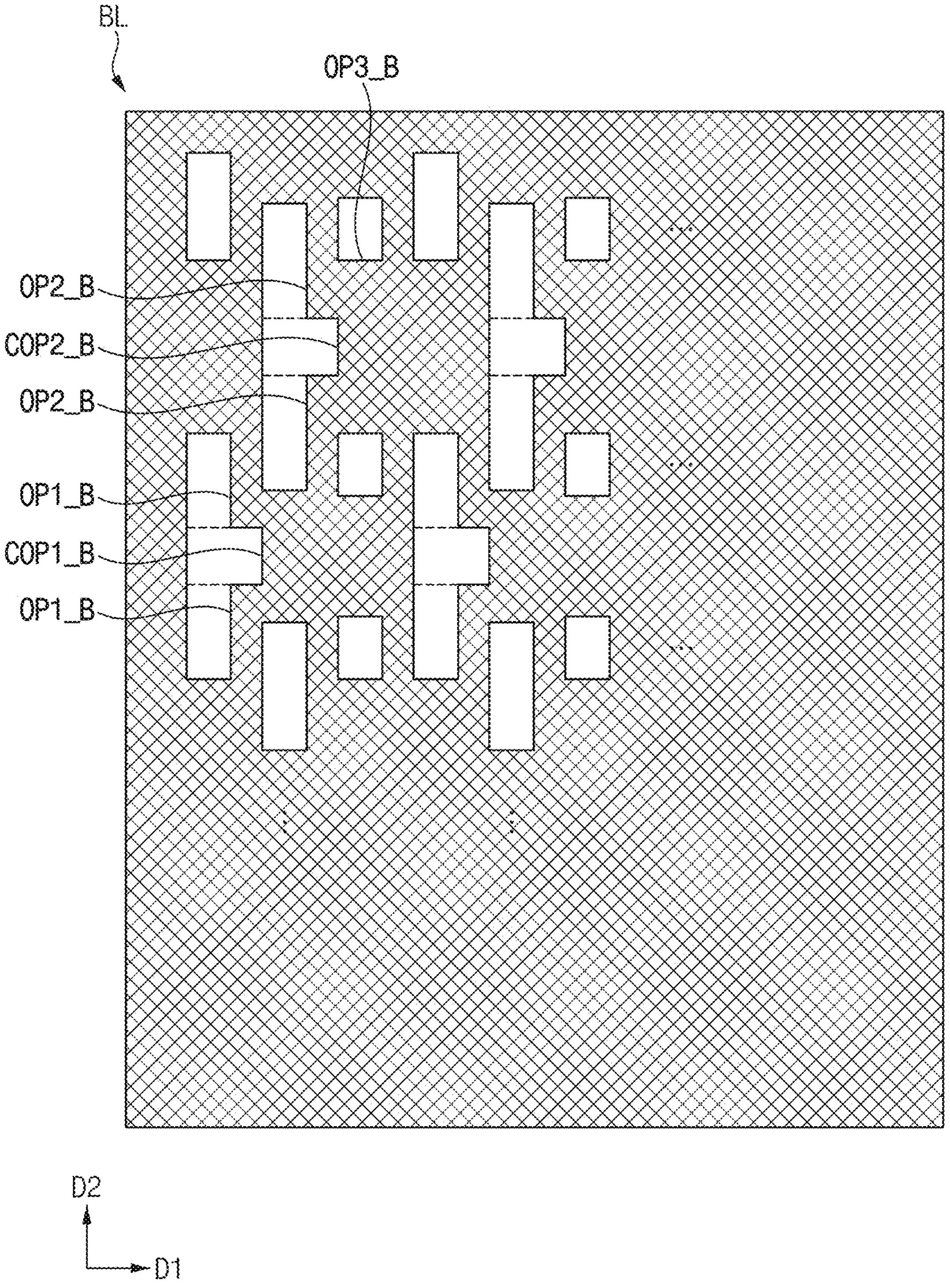
FIGS. 9, 10, 11, and 12 are plan views illustrating other embodiments of the bank layer of FIG. 5.

Referring to FIG. 9, in an embodiment, a first side of the first central opening COP1_B may protrude from the first sides of the first openings OP1_B extended to the first central opening COP1_B toward the first direction D1 and a first side of the second central opening COP2_B may protrude from first sides of the second openings OP2_B extended to the second central opening COP2_B toward the first direction D1. In this case, a second side of the first central opening COP1_B may be defined on the same line as second sides of the first openings OP1_B extended to the first central opening COP1_B, and second sides of the second central opening COP2_B may be defined on the same line as second sides of the second openings OP2_B extended to the second central opening COP2_B.

Figure 10:
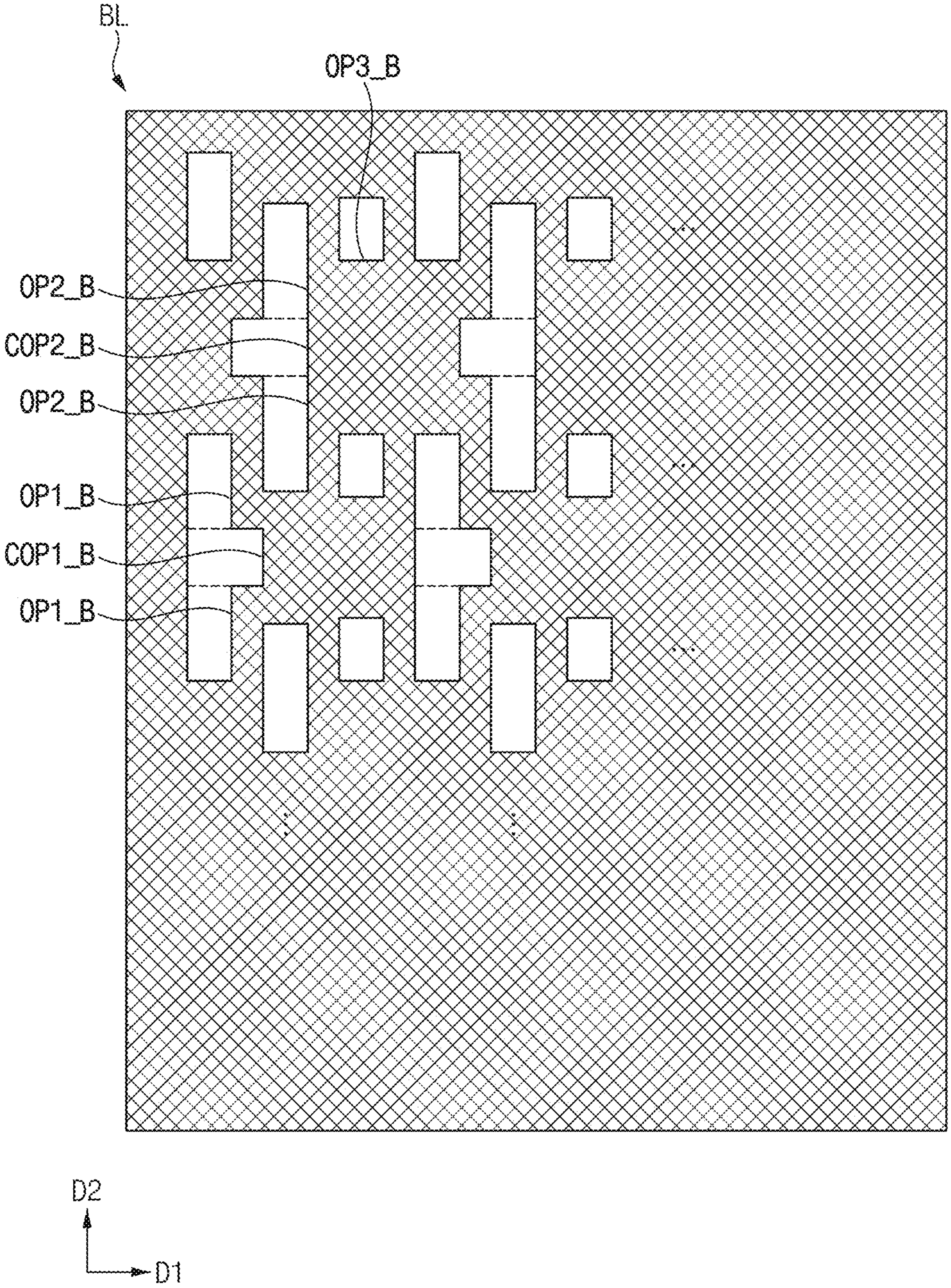

Referring to FIG. 10, in an embodiment, a first side of the first central opening COP1_B may protrude from first sides of the first openings OP1_B extended to the first central opening COP1_B toward the first direction D1 and a second side of the second central opening COP2_B may protrude from second sides of the second openings OP2_B extended to the second central opening COP2_B toward a direction opposite to the first direction D1. In this case, second sides of the first central opening COP1_B may be defined on the same line as second sides of the first openings OP1_B extended to the first central opening COP1_B, and a first side of the second central opening COP2_B may be defined on the same line as first sides of the second openings OP2_B extended to the second central opening COP2_B.

Figure 11:
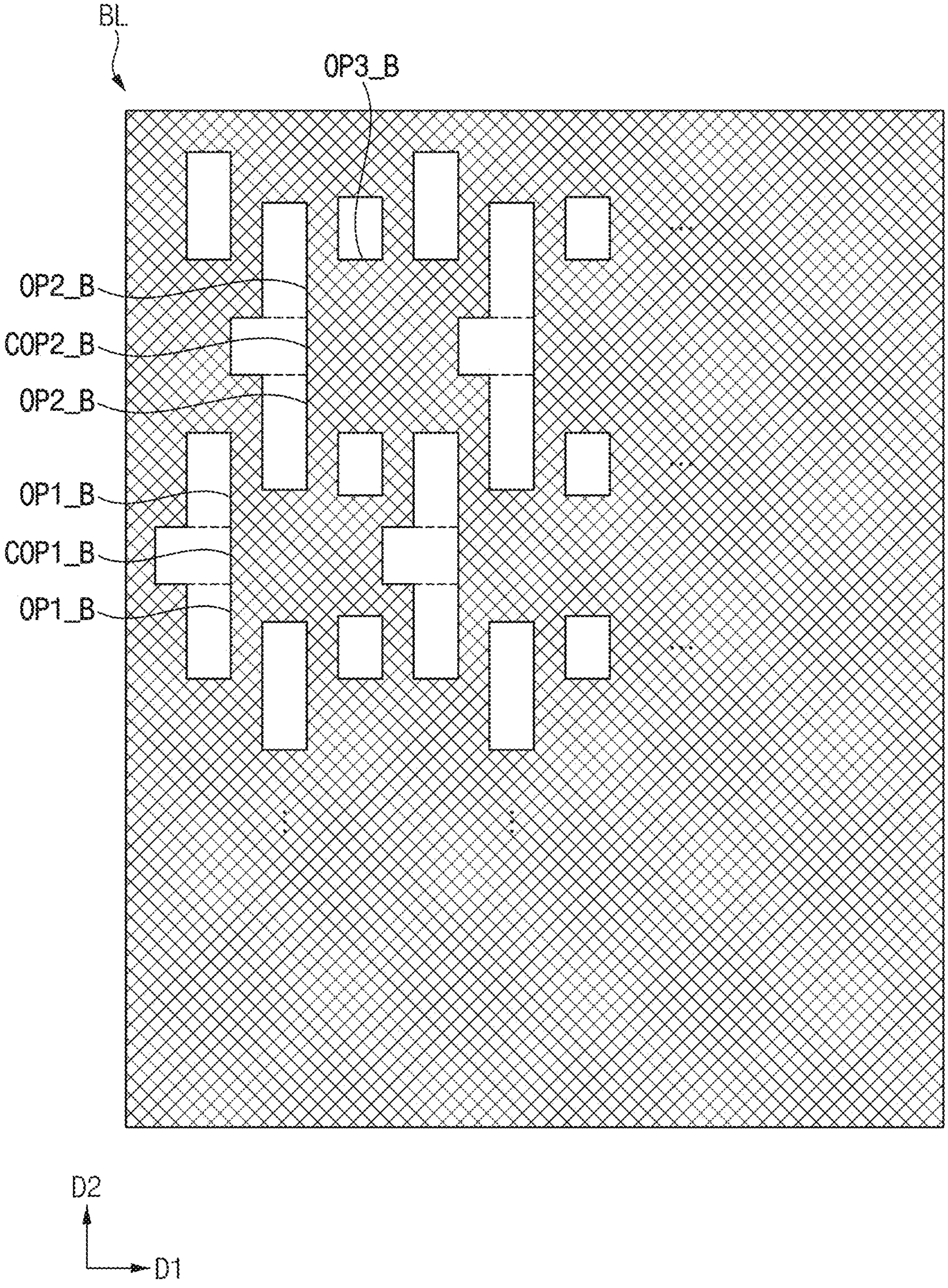

Referring to FIG. 11, in an embodiment, a second side of the first central opening COP1_B may protrude from second sides of the first openings OP1_B extended to the first central opening COP1_B toward the first direction D1 and second sides of the second central opening COP2_B may protrude from second sides of the second openings OP2_B extended to the second central opening COP2_B toward a direction opposite to the first direction D1. In this case, a first side of the first central opening COP1_B may be defined on the same line as first sides of the first openings OP1_B extended to the first central opening COP1_B, and a first side of the second central opening COP2_B. may be defined on the same line as first sides of the second openings OP2_B extended to the second central opening COP2_B.

Figure 12:
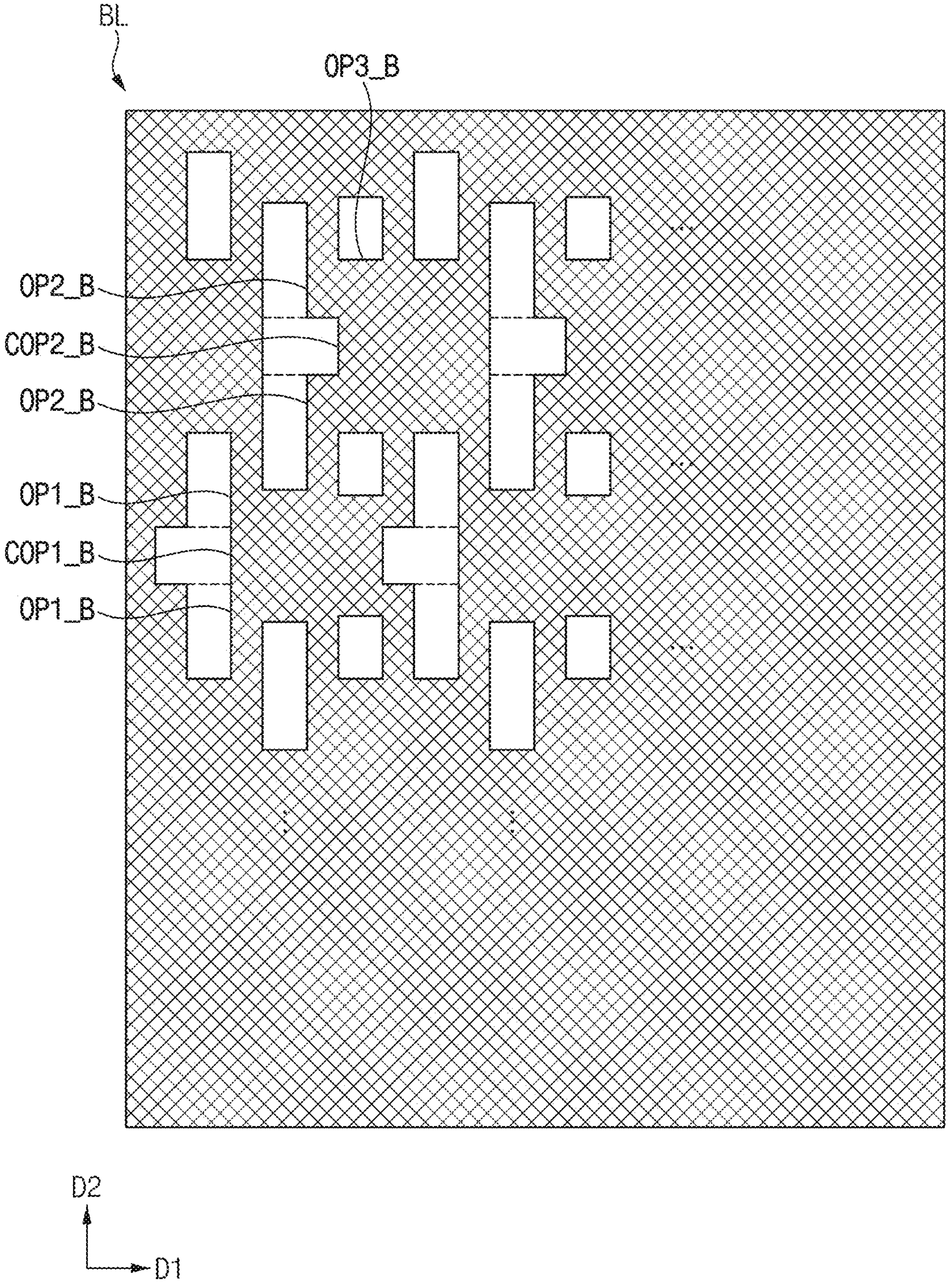

Referring to FIG. 12, in an embodiment, a second side of the first central opening COP1_B may protrude from second sides of the first openings OP1_B extended to the first central opening COP1_B toward a direction opposite to the first direction D1 and a first side of the second central opening COP2_B may protrude from first sides of the second openings OP2_B extended to the second central opening COP2_B toward the first direction D1. In this case, a first side of the first central opening COP1_B may be defined on the same line as a first side of the first openings OP1_B extended to the first central opening COP1_B, and a second side of the second central opening COP2_B may be defined on the same line as second sides of the second openings OP2_B extended to the second central opening COP2_B.

Figure 13:
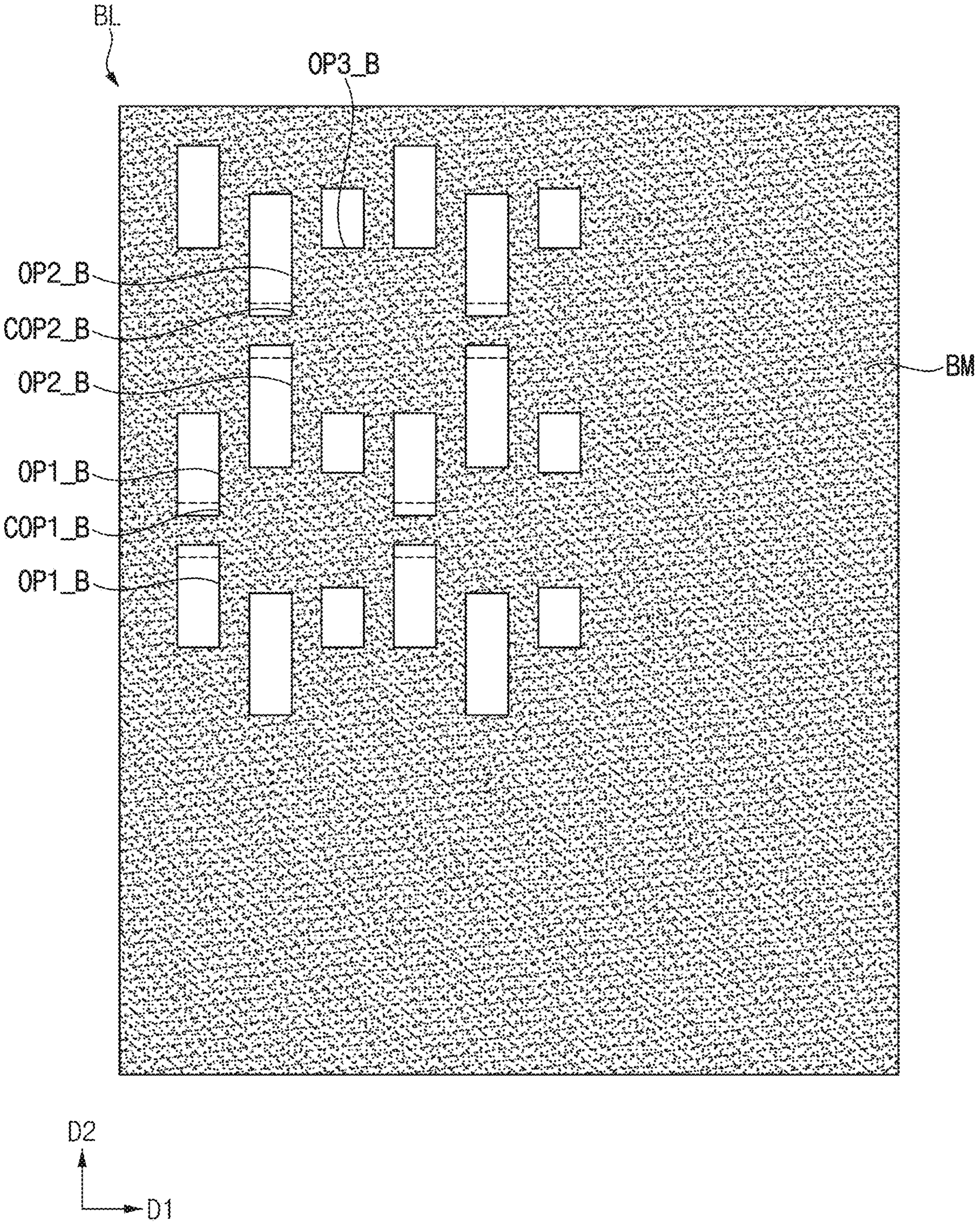
FIG. 13 is a plan view illustrating another embodiment of a bank layer and a light-blocking layer of FIG. 6.

FIG. 13 is a plan view illustrating another embodiment of a bank layer and a light-blocking layer of FIG. 6.

Hereinafter, descriptions overlapping with those of the light-blocking layer BM described with reference to FIG. 6 will be omitted or simplified.

Referring to FIGS. 3 and 13, the light-blocking layer BM may be disposed on the bank layer BL. The light-blocking layer BM may overlap the non-light-emitting area NEA. Specifically, the light-blocking layer BM may entirely overlap the non-light-emitting area NEA. In an embodiment, the light-blocking layer BM may partially overlap each of the first and second central openings COP1_B and COP2_B, expose an entirety of the first, second, and third openings OP1_B, OP2_B and OP3_B, be continuously extended in the non-light-emitting area NEA. Accordingly, the light-blocking layer BM may define the first, second, and third light-emitting areas EA1, EA2, and EA3.

Figure 14:
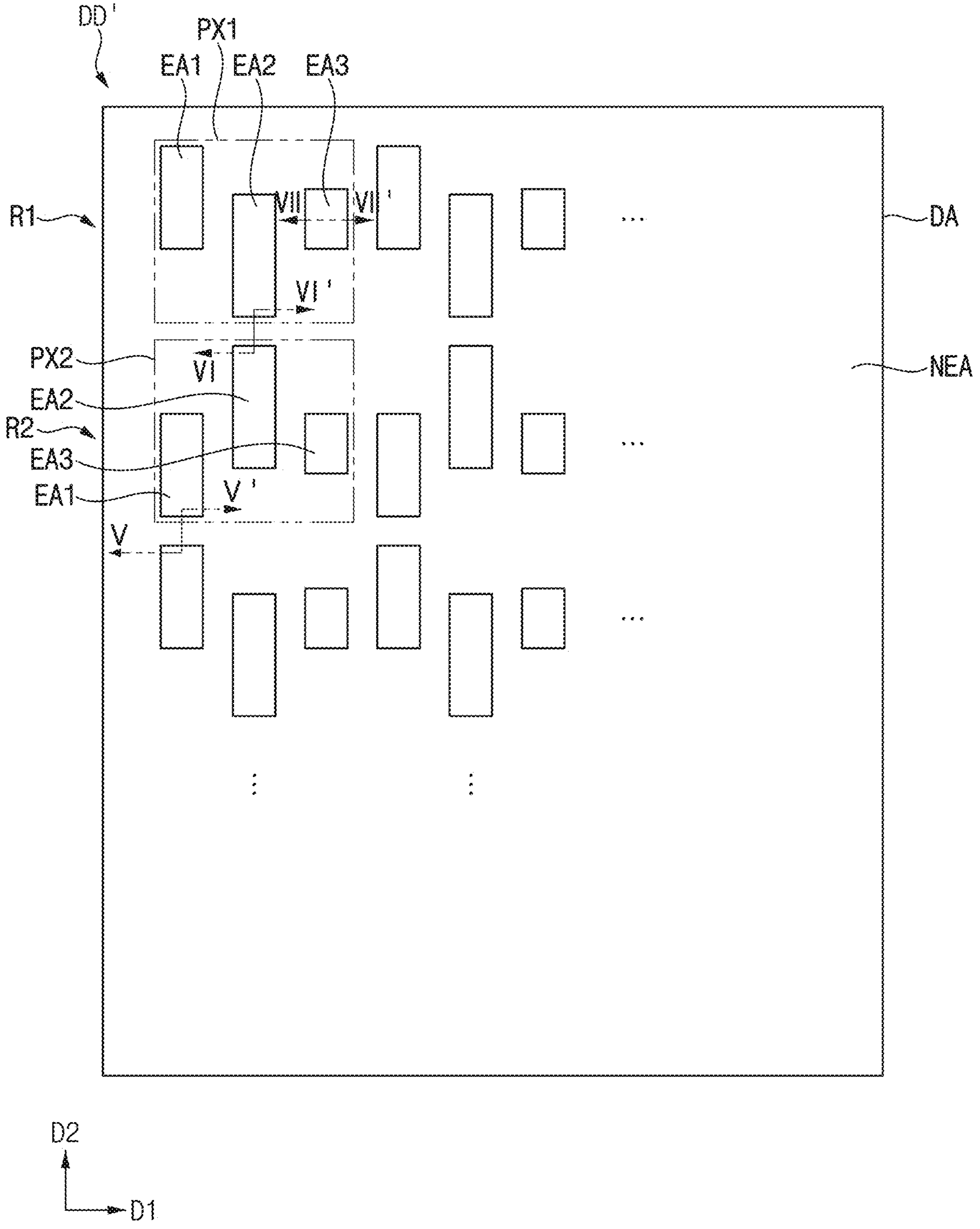
FIG. 14 is a plan view illustrating another embodiment of the display device of FIG. 3.
Figure 15:
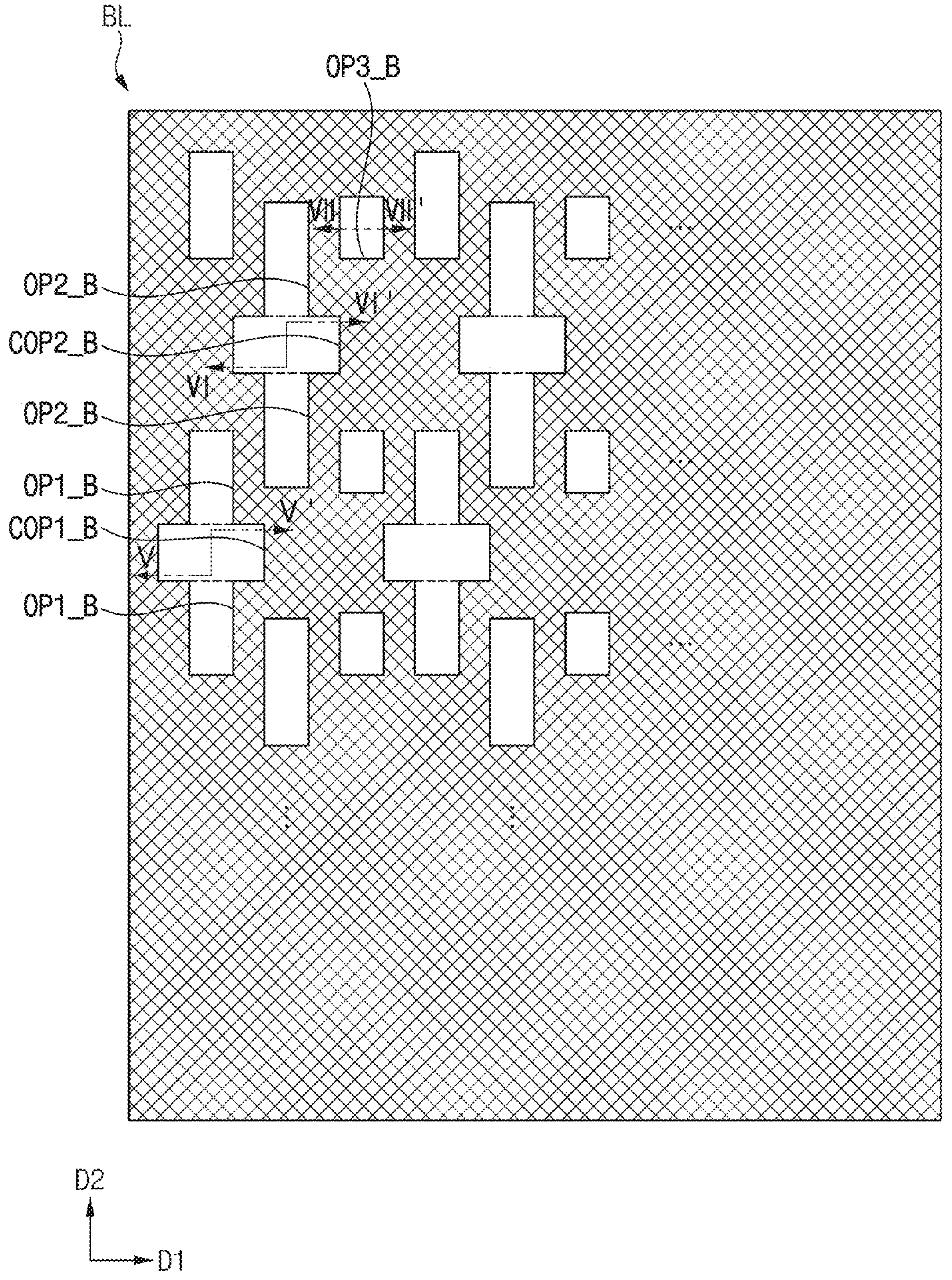
FIG. 15 is a plan view illustrating another embodiment of the bank layer of FIGS. 5 and 6.
Figure 16:
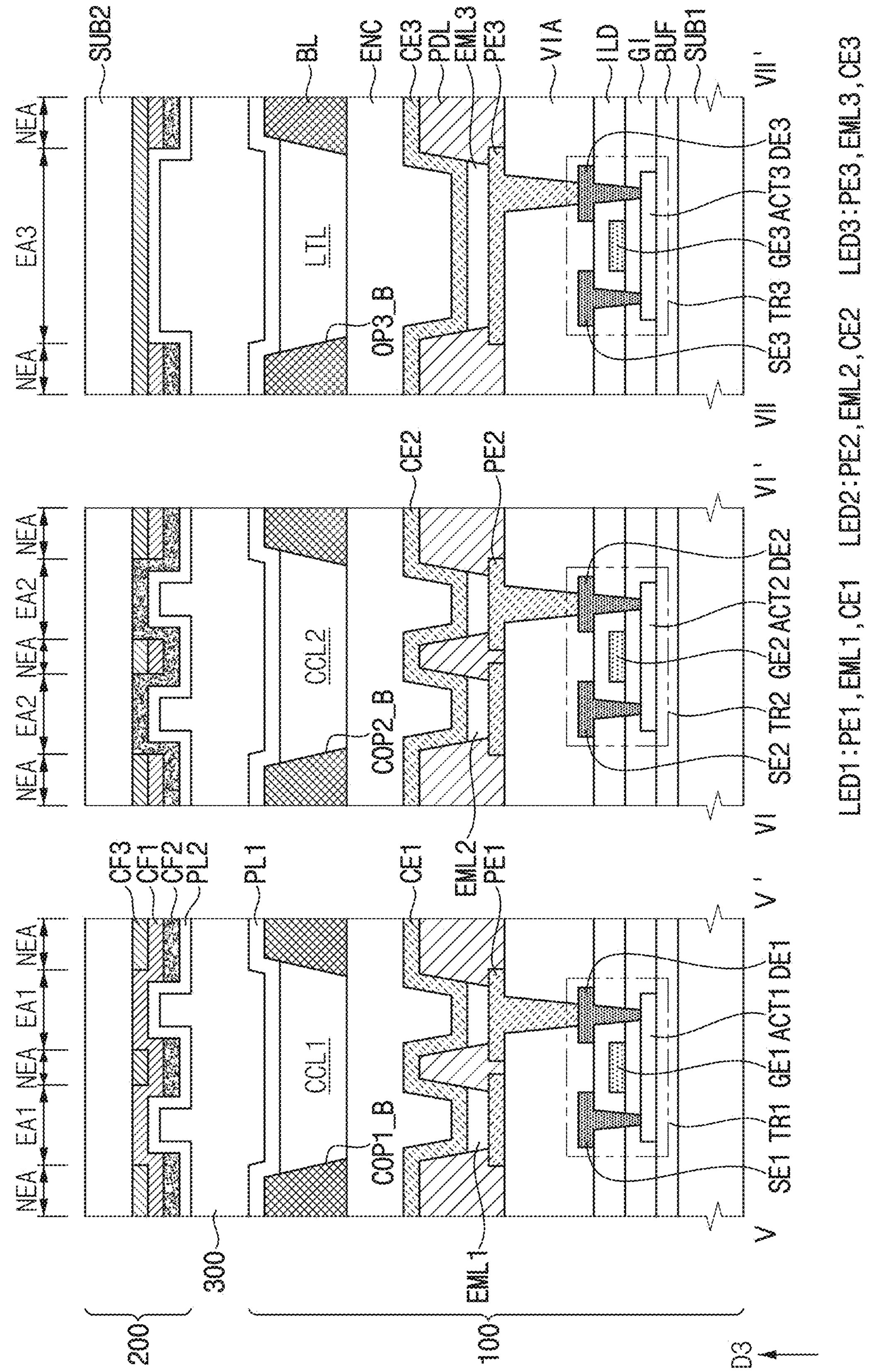
FIG. 16 is a cross-sectional view illustrating an embodiment of a cross section taken along lines V-V', VI-VI', and VII-VII' of FIGS. 14 and 15.

FIG. 14 is a plan view illustrating another embodiment of the display device of FIG. 3. FIG. 15 is a plan view illustrating another embodiment of the bank layer of FIGS. 5 and 6. FIG. 16 is a cross-sectional view illustrating an embodiment of a cross section taken along lines V-V', VI-VI', and VII-VII' of FIGS. 14 and 15.

Hereinafter, descriptions overlapping those of the display device DD described with reference to FIGS. 3 and 4 will be omitted or simplified.

Referring to FIGS. 14, 15 and 16, a display device DD' may include the lower structure 100, the filling layer 300, and the upper structure 200. Here, the lower structure 100 may include the first substrate SUB1, the buffer layer BUF, the first, second, and third transistors TR1, TR2, and TR3, the gate insulating layer GI, the inter-insulating layer ILD, the via-insulating layer VIA, the pixel defining layer PDL, the first, second, and third light-emitting elements LED1, LED2, and LED3, the encapsulation layer ENC, the bank layer BL, the first and second color conversion layers CCL1 and CCL2, the light transmission layer LTL, and the first passivation layer PL1. The upper structure 200 may include the second substrate SUB2, the first, second, and third color filters CF1, CF2, and CF3, and the second passivation layer PL2.

In an embodiment, a light-blocking layer may not be disposed on the bank layer BL. The first, second, and third color filters CF1, CF2, and CF3 may overlap each other in the non-light-emitting area NEA. In this case, the first, second, and third color filters CF1, CF2, and CF3 may define the first light-emitting area EA1, the second light-emitting area EA2, and the third light-emitting area EA3.

In addition, although the bank layer BL, the first color conversion layer CCL1, the second color conversion layer CCL2, and the light transmission layer LTL is illustrated as being included in the lower structure 100 in FIGS. 15 and 16, the disclosure is not limited thereto. In an alternative embodiment, the bank layer BL, the first color conversion layer CCL1, the second color conversion layer CCL2, and the light transmission layer LTL may be included in the upper structure 200.

Figure 17:
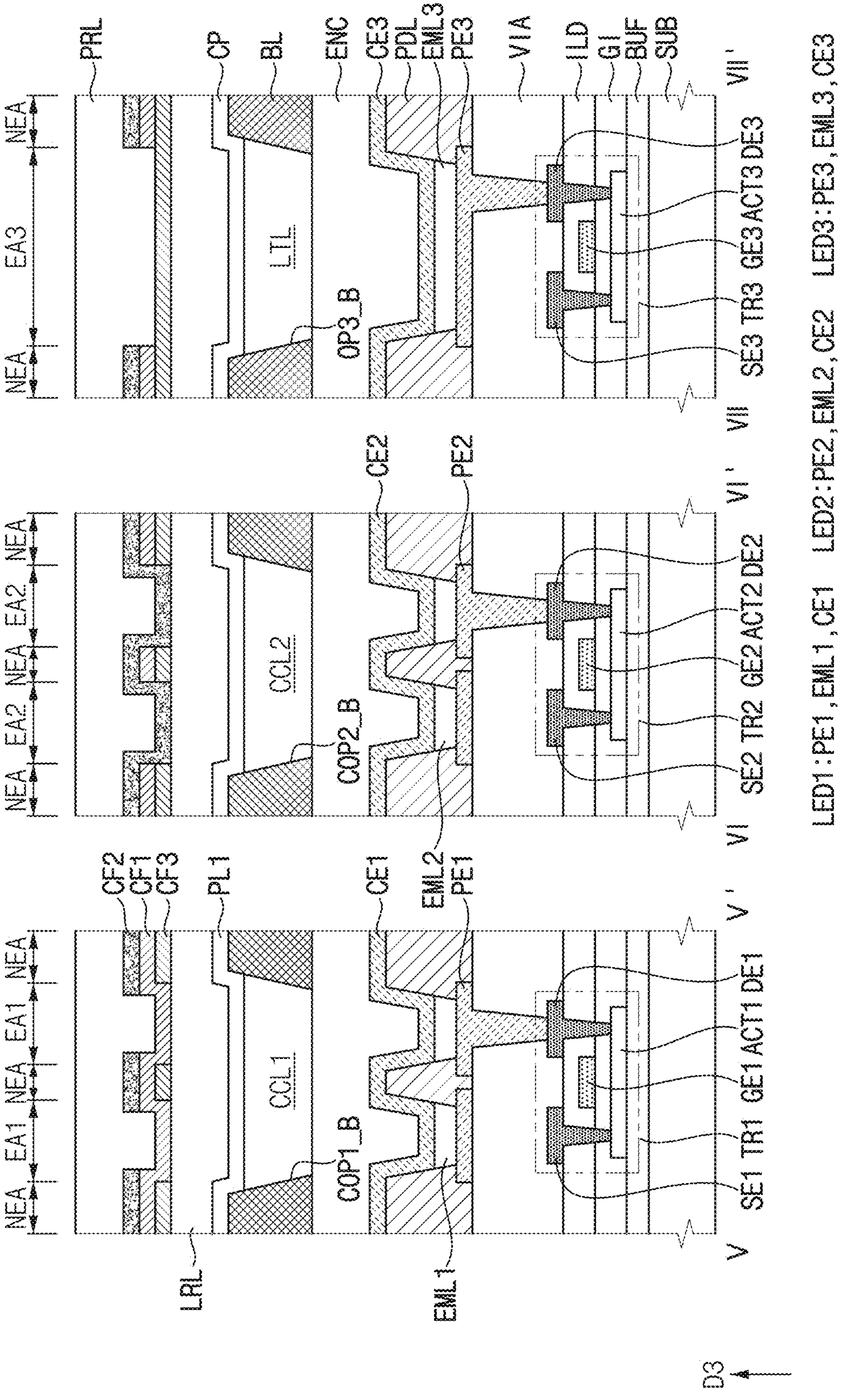
FIG. 17 is a cross-sectional view illustrating another embodiment of a cross section taken along lines V-V', VI-VI', and VII-VII' of FIGS. 14 and 15.

FIG. 17 is a cross-sectional view illustrating another embodiment of a cross section taken along lines V-V', VI-VI', and VII-VII' of FIGS. 14 and 15.

Hereinafter, descriptions overlapping those of the display device DD' described with reference to FIG. 16 will be omitted or simplified.

Referring to FIGS. 14, 15, and 17, the display device DD' may include a substrate SUB, the buffer layer BUF, the first, second, and third transistors TR1, TR2, and TR3, the gate insulating layer GI, the inter-insulating layer ILD, the via-insulating layer VIA, the pixel defining layer PDL, the first, second, and third light-emitting elements LED1, LED2, and LED3, the encapsulation layer ENC, the bank layer BL, the first and second color conversion layers CCL1 and CCL2, the light transmission layer LTL, a capping layer CP, a low refractive index layer LRL, the first, second, and third color filters CF1, CF2, and CF3 and a passivation layer PL.

The display device DD' may have a single substrate structure. In an embodiment, the bank layer BL, the first color conversion layer CCL1, the second color conversion layer CCL2, the light transmission layer LTL, the first color filter CF1, the second color filter CF2, and the third color filter CF3 may be directly disposed on the encapsulation layer ENC, for example.

The capping layer CP may be disposed on the bank layer BL, the first color conversion layer CCL1, the second color conversion layer CCL2, and the light transmission layer LTL. The capping layer CP may cover the first bank layer BL, the first color conversion layer CCL1, the second color conversion layer CCL2, and the light transmission layer LTL. In an embodiment, the capping layer CP may include an inorganic material such as silicon oxide, silicon nitride, silicon oxynitride, or the like, for example. These may be used alone or in any combinations with each other.

The low refractive index layer LRL may be disposed on the capping layer CP. The low refractive index layer LRL may have a relatively low refractive index. In an embodiment, the refractive index of the low refractive index layer LRL may be lower than the refractive index of each of the first color conversion layer CCL1, the second color conversion layer CCL2, and the light transmission layer LTL, for example. The low refractive index layer LRL may include an organic material. In an embodiment, the low refractive index layer LRL may include an organic polymer material including silicon, for example.

In an embodiment, a light-blocking layer may not be disposed on the bank layer BL. In this case, the first, second, and third color filters CF1, CF2, and CF3 may define the first light-emitting area EA1, the second light-emitting area EA2, and the third light-emitting area EA3.

A color filter layer may be disposed on the relatively low refractive index layer LRL. The color filter layer may include the first color filter CF1, the second color filter CF2, and the third color filter CF3.

The passivation layer PRL may be disposed on the first color filter CF1, the second color filter CF2, and the third color filter CF3. The passivation layer PRL may cover the first color filter CF1, the second color filter CF2, and the third color filter CF3. The passivation layer PRL may include an inorganic material and/or an organic material. In an embodiment, the passivation layer PRL may include an inorganic material such as silicon oxide, silicon nitride, silicon oxynitride, or the like, for example. These may be used alone or in any combinations with each other.

Figure 18:
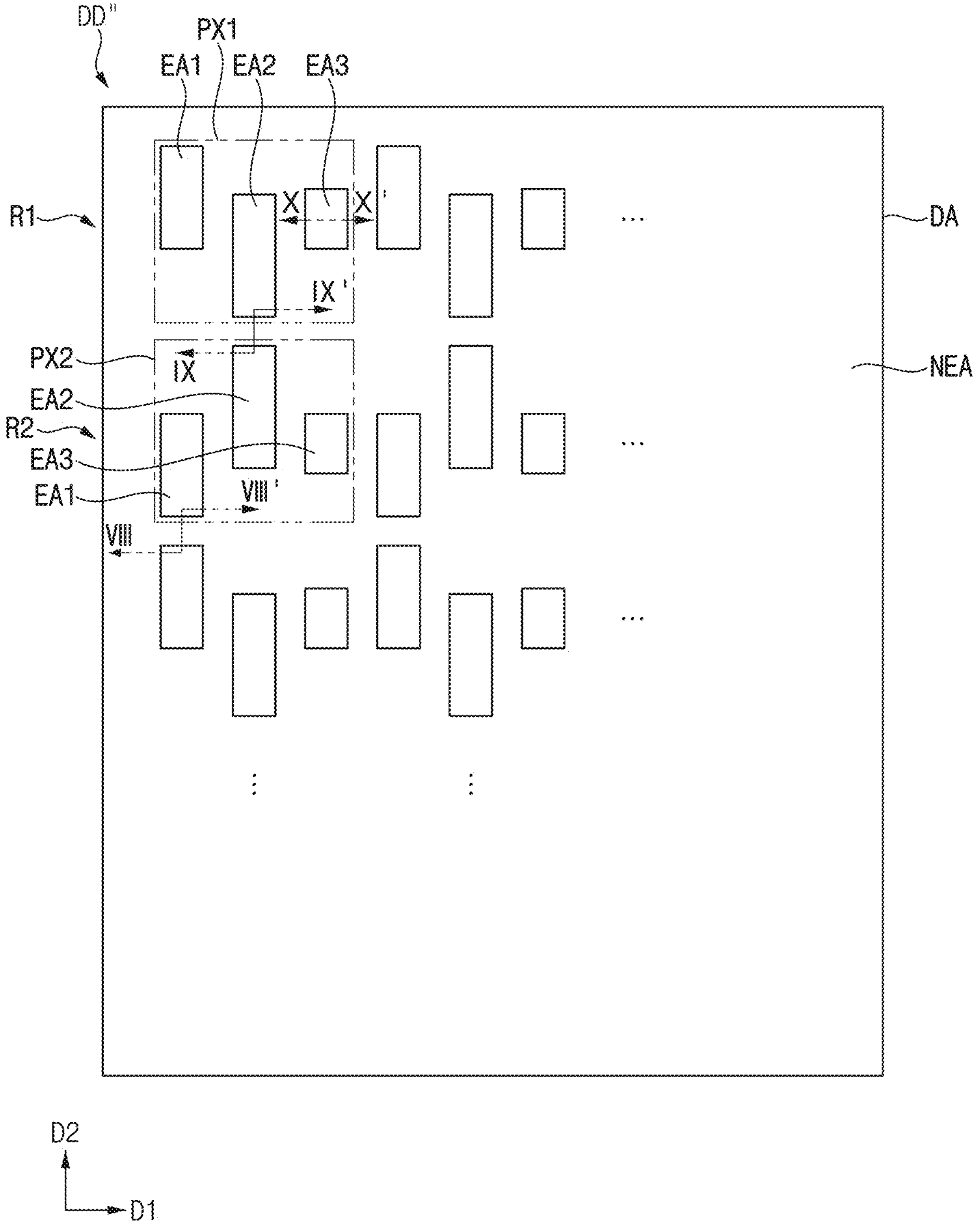
FIG. 18 is a plan view illustrating still another embodiment of the display device of FIG. 3.
Figure 19:
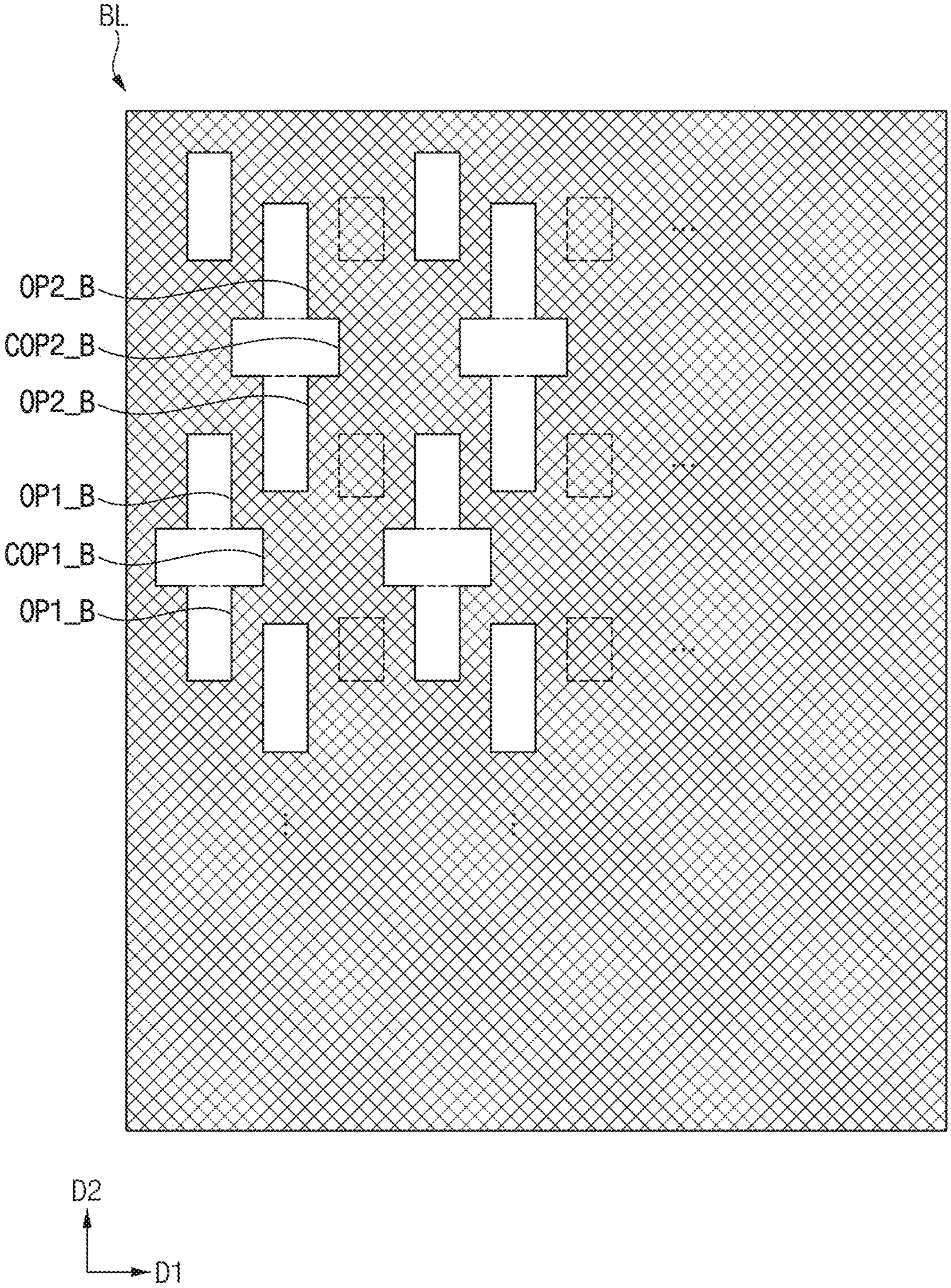
FIG. 19 is a plan view illustrating still another embodiment of the bank layer of FIG. 5.
Figure 20:
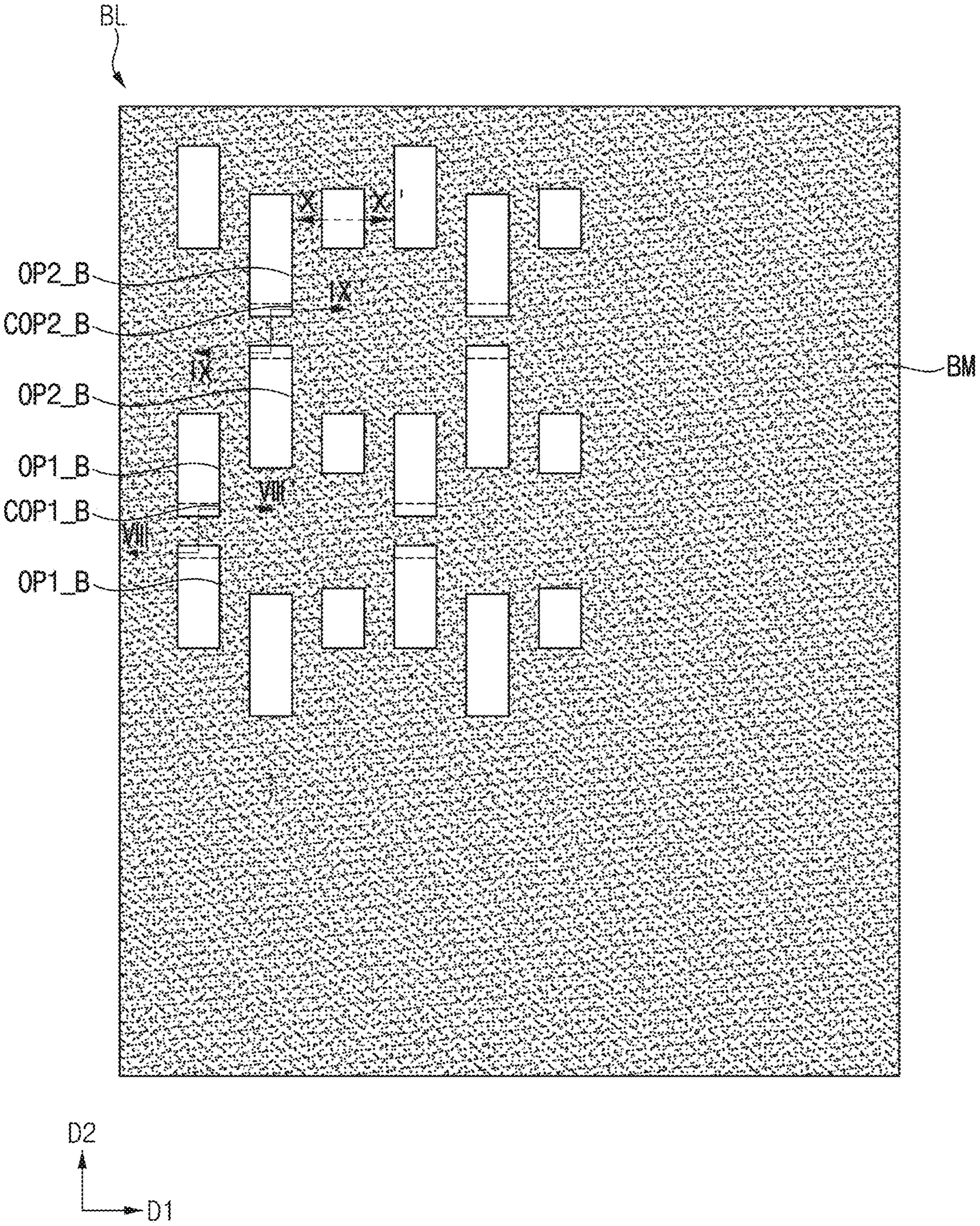
FIG. 20 is a plan view illustrating still another embodiment of the bank layer and the light-blocking layer of FIG. 6.
Figure 21:
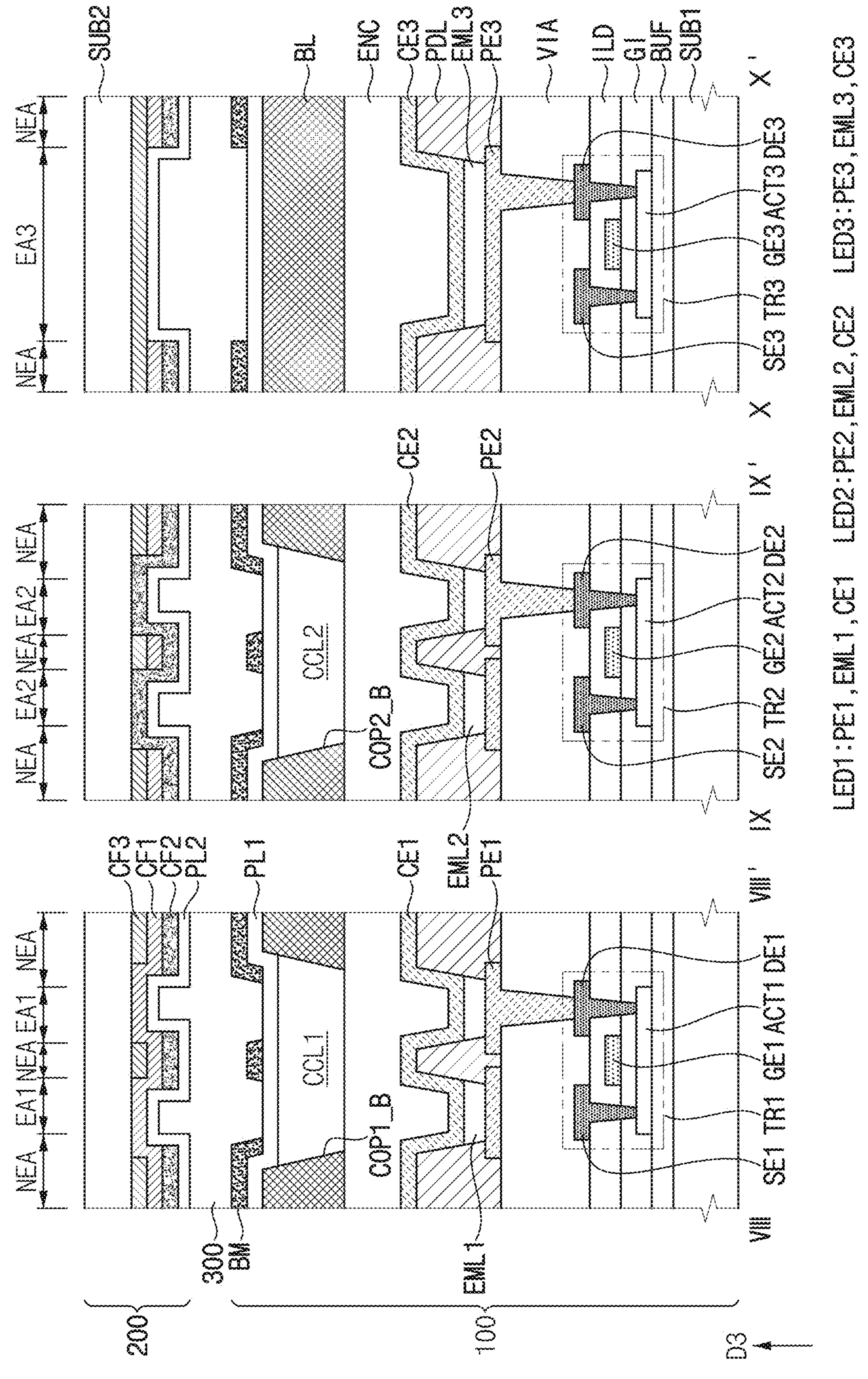
FIG. 21 is a cross-sectional view taken along lines VIII-VIII', IX-IX', and X-X' of FIGS. 18 and 20.

FIG. 18 is a plan view illustrating still another embodiment of the display device of FIG. 3. FIG. 19 is a plan view illustrating still another embodiment of the bank layer of FIG. 5. FIG. 20 is a plan view illustrating still another embodiment of the bank layer and the light-blocking layer of FIG. 6. FIG. 21 is a cross-sectional view taken along lines VIII-VIII', IX-IX', and X-X' of FIGS. 18 and 20.

Hereinafter, descriptions overlapping those of the display device DD described with reference to FIGS. 3, 4, 5, 6, and 7 will be omitted or simplified.

Referring to FIGS. 18, 19, 20, and 21, a display device DD" may include the lower structure 100, the filling layer 300, and the upper structure 200. Here, the lower structure 100 may include the first substrate SUB1, the buffer layer BUF, the first, second, and third transistors TR1, TR2, and TR3, the gate insulating layer GI, the inter-insulating layer ILD, the via-insulating layer VIA, the pixel defining layer PDL, the first, second, and third light-emitting elements LED1, LED2, and LED3, the encapsulation layer ENC, the bank layer BL, the first and second color conversion layers CCL1 and CCL2, the light transmission layer LTL, and the first passivation layer PL1. The upper structure 200 may include the second substrate SUB2, the first, second, and third color filters CF1, CF2, and CF3, and the second passivation layer PL2.

The bank layer BL may be disposed on the encapsulation layer ENC. The bank layer BL may overlap the non-light-emitting area NEA. The first opening OP1_B, the second opening OP2_B, the first central opening COP1_B, and the second central opening COP2_B may be defined in the bank layer BL. The first central opening COP1_B may extend to the two adjacent first openings OP1_B, and the second central opening COP2_B may extend to the two adjacent second openings OP2_B. In an embodiment, the bank layer BL may further overlap the third light-emitting area EA3. That is, an opening may not be formed in the bank layer BL in the third light-emitting area EA3.

In an embodiment, the bank layer BL may include a base resin in which scattering particles are dispersed. In an embodiment, the base resin may include a photosensitive organic material having relatively high light transmittance, for example. Accordingly, the part of the bank layer BL overlapping the third light-emitting area EA3 may transmit light emitted from the third light-emitting element LED3. That is, the part of the bank layer BL overlapping the third light-emitting area EA3 may serve as the light transmission layer LTL shown in FIG. 7.

The light-blocking layer BM may be disposed on the bank layer BL. The light-blocking layer BM may overlap the non-light-emitting area NEA. Specifically, the light-blocking layer BM may entirely overlap the non-light-emitting area NEA. In an embodiment, the light-blocking layer BM may partially overlap each of the first and second central openings COP1_B and COP2_B, expose an entirety of the first and second openings OP1_B and OP2_B, and be continuously extended in the non-light-emitting area NEA. In addition, the light-blocking layer BM may expose an entirety of the part of the bank layer BL overlapping the third light-emitting area EA3. Accordingly, the light-blocking layer BM may define the first, second, and third light-emitting areas EA1, EA2, and EA3.

In addition, although the bank layer BL, the first color conversion layer CCL1, the second color conversion layer CCL2, and the light-blocking layer BM is illustrated as being included in the lower structure 100 in FIG. 21, the disclosure is not limited thereto. In an alternative embodiment, the bank layer BL, the first color conversion layer CCL1, the second color conversion layer CCL2, and the light-blocking layer BM may be included in the upper structure 200.

The disclosure may be applied to various display devices. In an embodiment, the invention may be applied to high-resolution smartphones, mobile phones, smart pads, smart watches, tablet PCs, vehicle navigation systems, televisions, computer monitors, laptops, or the like, for example.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims. Therefore, it is to be understood that the foregoing is illustrative of various embodiments and is not to be construed as limited to the illustrative embodiments disclosed, and that modifications to the disclosed embodiments, as well as other embodiments, are intended to be included within the scope of the appended claims.

What is claimed is:

1. A display device comprising:

a substrate including a first pixel area and a second pixel area disposed adjacent to each other, each of the first pixel area and the second pixel area including a first light-emitting area, a second light-emitting area, a third light-emitting area, and a non-light-emitting area;

a light-emitting element disposed in each of the first, second, and third light-emitting areas on the substrate;

a bank layer disposed in the non-light-emitting area on the light-emitting element and defining first openings respectively overlapping the first light-emitting areas of the first and second pixel areas and a first central opening extending to the first openings; and a first color conversion layer including first quantum dots and filling the first openings and the first central opening.

2. The display device of claim 1, wherein the bank layer further defines:

second openings respectively overlapping the second light-emitting areas of the first and second pixel areas;

third openings respectively overlapping the third light-emitting areas of the first and second pixel areas; and a second central opening extending to the second openings.

3. The display device of claim 2, wherein a center of the first central opening is defined on a same line as centers of the first openings in a plan view and a center of the second central opening is defined on a same line as centers of the second openings in the plan view.

4. The display device of claim 2, wherein a first side of the first central opening protrudes from first sides of the first openings toward a first direction and a first side of the second central opening protrudes from first sides of the second openings toward the first direction.

5. The display device of claim 2, wherein a first side of the first central opening protrudes from first sides of the first openings toward a first direction and a first side of the second central opening protrudes from first sides of the second openings toward a direction opposite to the first direction.

6. The display device of claim 2, further comprising:

a second color conversion layer filling the second openings and the second central opening and including second quantum dots.

7. The display device of claim 2, further comprising:

a light transmission layer filling each of the third openings, wherein the light transmission layer includes a photosensitive organic material having light transmittance in which scattering particles are dispersed.

8. The display device of claim 2, wherein the third openings are spaced apart from each other in a plan view.

9. The display device of claim 2, further comprising:

a light-blocking layer disposed in the non-light-emitting area on the bank layer and partially overlapping each of the first and second central openings.

10. The display device of claim 9, wherein the light-blocking layer includes a plurality of light-blocking patterns spaced apart from each other.

11. The display device of claim 10, wherein each of the plurality of light-blocking patterns has an "H" shape in a plan view.

12. The display device of claim 9, wherein the light-blocking layer exposes an entirety of the first, second, and third openings and continuously extends in the non-light-emitting area.

13. The display device of claim 9, further comprising:

a column spacer disposed in the non-light-emitting area on the bank layer and including a same material as a material of the light-blocking layer.

14. The display device of claim 1, wherein the bank layer includes an inorganic material or an organic material having a black color.

15. The display device of claim 1, wherein the bank layer further defines second openings respectively overlapping the second light-emitting areas of the first and second pixel areas and a second central opening extending to the second openings, and wherein the bank layer overlaps the third light-emitting area.

16. The display device of claim 15, wherein the bank layer includes a photosensitive organic material having light transmittance in which scattering particles are dispersed.

17. The display device of claim 15, further comprising:

a light-blocking layer disposed on the bank layer, partially overlapping each of the first and second central openings, exposing an entirety of the first and second openings, and continuously extending in the non-light-emitting area.

18. The display device of claim 2, further comprising:

a first color filter entirely overlapping the first central opening and partially overlapping the second central opening;

a second color filter partially overlapping the first central opening and entirely overlapping the second central opening; and a third color filter partially overlapping each of the first and second central openings and entirely overlapping the third openings.

19. The display device of claim 2, wherein the first light-emitting area emits red light, the second light-emitting area emits green light, and the third light-emitting area emits blue light.

20. A display device comprising:

A substrate including a first pixel area and a second pixel area disposed adjacent to each other, each of the first pixel area and the second pixel area including a first light-emitting area that emits light of a first color, a second light-emitting area that emits light of a second color, a third light-emitting area that emits light of a third color, and a non-light-emitting area;

a light-emitting element disposed in each of the first, second, and third light-emitting areas on the substrate;

a bank layer disposed in the non-light-emitting area on the light-emitting element and defining first openings respectively overlapping the first light-emitting areas of the first and second pixel areas, second openings respectively overlapping the second light-emitting areas of the first and second pixel areas, third openings respectively overlapping the third light-emitting areas of the first and second pixel areas, a first central opening extending to the first openings, and a second central opening extending to the second openings;

a first color conversion layer including first quantum dots and filling the first openings and the first central opening;

a second color conversion layer including second quantum dots and filling the second openings and the second central opening;

a light transmission layer including a photosensitive organic material having light transmittance in which scattering particles are dispersed and filling the third openings; and a light-blocking layer disposed on the bank layer and partially overlapping each of the first and second central openings.

* * * * *